(12) United States Patent
Choi

(10) Patent No.: US 12,131,679 B2
(45) Date of Patent: Oct. 29, 2024

(54) DISPLAY PANEL AND DISPLAY DEVICE INCLUDING THE SAME

(71) Applicant: Samsung Display Co., LTD., Yongin-si (KR)

(72) Inventor: Junwon Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/370,920

(22) Filed: Sep. 21, 2023

(65) Prior Publication Data

US 2024/0161674 A1 May 16, 2024

(30) Foreign Application Priority Data

Nov. 15, 2022 (KR) .................. 10-2022-0152374

(51) Int. Cl.
*G09G 3/32* (2016.01)
*G09G 3/20* (2006.01)

(52) U.S. Cl.
CPC ............ *G09G 3/2003* (2013.01); *G09G 3/32* (2013.01); *G09G 2300/0443* (2013.01); *G09G 2300/0452* (2013.01); *G09G 2310/0267* (2013.01); *G09G 2310/0275* (2013.01); *G09G 2320/068* (2013.01)

(58) Field of Classification Search
CPC ......... G09G 3/2003; G09G 3/30–3291; G09G 2300/0443; G09G 2300/0452; G09G 2310/0267; G09G 2310/0275; G09G 2320/068
See application file for complete search history.

(56) References Cited

U.S. PATENT DOCUMENTS 11,967,271 B2 * 4/2024 Yao ..................... G09G 3/3233
11,978,398 B2 * 5/2024 Hong .................. H10K 59/121
(Continued)

FOREIGN PATENT DOCUMENTS

KR 1020130076677 A 7/2013
KR 1020210072544 A 6/2021
KR 1020220096188 A 7/2022

OTHER PUBLICATIONS

Extended European Search Report for Application No. 23195415.7-1207 dated Apr. 15, 2024.
(Continued)

*Primary Examiner* — Gene W Lee
(74) *Attorney, Agent, or Firm* — CANTOR COLBURN LLP

(57) ABSTRACT

A display panel includes first pixels which emit light of different colors, a second pixels which emit light of different colors, a light blocking member on the first and second pixels to block a portion of light emitted therefrom. Each of the first and second pixels includes a pixel circuit, a main light emitting device connected to the pixel circuit, and an auxiliary light emitting device which emits light of a same color as the main light emitting device and is connected to the main light emitting device. The main light emitting device of a first pixel and the auxiliary light emitting device of a second pixel are disposed in a first unit pixel area, and the main light emitting device of the second pixel and the auxiliary light emitting device of the first pixel are disposed in a second unit pixel area adjacent to the first unit pixel area.

22 Claims, 21 Drawing Sheets

(56) References Cited

U.S. PATENT DOCUMENTS

| | | |
|---|---|---|
| 12,004,411 B2 * | 6/2024 | Hong .................. H10K 59/121 |
| 2015/0145907 A1 | 5/2015 | Ryu |
| 2022/0301498 A1 | 9/2022 | Park et al. |
| 2024/0099058 A1 * | 3/2024 | Choi ........................ G09G 3/32 |
| 2024/0127760 A1 * | 4/2024 | Cho ..................... G09G 3/3266 |
| 2024/0138240 A1 * | 4/2024 | Lee ..................... H10K 59/879 |

OTHER PUBLICATIONS

Partial European Search Report for Application No. 23195415.7-1210 dated Dec. 12, 2023.

* cited by examiner

T3:T3-1,T3-2
T4:T4-1,T4-2,T4-3

DISPLAY PANEL AND DISPLAY DEVICE INCLUDING THE SAME

This application claims priority to Korean Patent Application No. 10-2022-0152374, filed on Nov. 15, 2022, and all the benefits accruing therefrom under 35 U.S.C. § 119, the content of which in its entirety is herein incorporated by reference.

BACKGROUND

1. Field

The disclosure relates to a display panel and a display device including the display panel. More specifically, the disclosure relates to a display panel having an adjustable viewing angle and a display device including the display panel.

2. Description of the Related Art

A flat panel display device is widely used as a display device replacing a cathode ray tube display device due to characteristics such as light weight and thin shape. Representative examples of such a flat panel display include a liquid crystal display and an organic light emitting display.

The display device typically includes a display panel and a panel driver. In general, the display panel is manufactured to have a wide viewing angle, but it may be desired to temporarily implement a narrow viewing angle so that no one other than the user can see the screen in a public place.

SUMMARY

Embodiments provide a display panel capable of adjusting a viewing angle without reducing resolution.

Embodiments provide a display device capable of adjusting a viewing angle without reducing resolution.

A display panel according to an embodiment includes a plurality of first pixels which emit light of different colors from each other, a plurality of second pixels which emit light of different colors from each other, a light blocking member disposed on the first pixels and the second pixels, and where the light blocking member blocks a portion of light emitted from the first pixels and a portion of light emitted from the second pixels. In such an embodiment, each of the first pixels includes a first pixel circuit, a first main light emitting device electrically connected to the first pixel circuit, and a first auxiliary light emitting device which emits light of a same color as the first main light emitting device and is electrically connected to the first main light emitting device, each of the second pixels includes a second pixel circuit, a second main light emitting device electrically connected to the second pixel circuit, and a second auxiliary light emitting device which emits light of a same color as the second main light emitting device and is electrically connected to the second main light emitting device. In such an embodiment, the first main light emitting device and the second auxiliary light emitting device are disposed in a first unit pixel area, and the second main light emitting device and the first auxiliary light emitting device are disposed in a second unit pixel area adjacent to the first unit pixel area.

In an embodiment, an operation of the first auxiliary light emitting device may be controlled by the first pixel circuit and an operation of the second auxiliary light emitting device may be controlled by the second pixel circuit.

In an embodiment, an operation of the first main light emitting device and an operation of the first auxiliary light emitting device may be controlled together by the first pixel circuit, and an operation of the second main light emitting device and an operation of the second auxiliary light emitting device may be controlled together by the second pixel circuit.

In an embodiment, the first main light emitting device of one first pixel and the second auxiliary light emitting device of one second pixel corresponding to the one first pixel may emit light of a same color as each other, and the second main light emitting device of the one second pixel and the first auxiliary light emitting device of the one second pixel may emit light of a same color as each other.

In an embodiment, the display panel may further include a first transmission line electrically connected to the first auxiliary light emitting device and the first main light emitting device and a second transmission line electrically connected to the second auxiliary light emitting device and the second main light emitting device.

In an embodiment, the first transmission line and the second transmission line may include a transparent conductive oxide.

In an embodiment, the display panel may further include a data line which transmits a data voltage to the first pixels and the second pixels and the first transmission line and the second transmission line may be disposed in a same layer as the data line.

In an embodiment, the first transmission line and the second transmission line may include a same material as the data line.

In an embodiment, a pixel opening exposing a portion of a pixel electrode of the first main light emitting device and a pixel opening exposing a portion of a pixel electrode of the second auxiliary light emitting device may be defined in the first unit pixel area and a pixel opening exposing a portion of a pixel electrode of the second main light emitting device and a pixel opening exposing a portion of the pixel electrode of the first auxiliary light emitting device may be defined in the second unit pixel area.

In an embodiment, a number of the first main light emitting device disposed in the first unit pixel area and a number of the second auxiliary light emitting device disposed in the first unit pixel area may be the same as each other, and a number of the second main light emitting device disposed in the second unit pixel area and a number of the first auxiliary light emitting device disposed in the second unit pixel area may be the same as each other.

In an embodiment, the first pixels may include a first first pixel, a second first pixel, and a third first pixel, the first main light emitting device of the first first pixel, the first main light emitting device of the second first pixel, and the first main light emitting device of the third first pixel may be arranged in a line in the first unit pixel area, and the first auxiliary light emitting device of the first first pixel, the first auxiliary light emitting device of the second first pixel, and the first auxiliary light emitting device of the third first pixel may be arranged in a line in the second unit pixel area.

In an embodiment, the second pixels may include a first second pixel, a second second pixel, and a third second pixel, the second main light emitting device of the first second pixel, the second main light emitting device of the second second pixel, and the second main light emitting device of the third second pixel may be arranged in a line in the second unit pixel area, and the second auxiliary light emitting device of the first second pixel, the second auxiliary light emitting device of the second second pixel, and the second auxiliary light emitting device of the third second pixel may be arranged in a line in the first unit pixel area.

In an embodiment, the first pixels may include a first first pixel, a second first pixel, and a third first pixel, the first main light emitting device of the first first pixel, the first main light emitting device of the second first pixel, and the first main light emitting device of the third first pixel may be disposed at vertices of imaginary triangles in the first unit pixel area, and the first auxiliary light emitting device of the first first pixel, the first auxiliary light emitting device of the second first pixel, and the first auxiliary light emitting device of the third first pixel may be disposed at vertices of imaginary triangles in the second unit pixel area.

In an embodiment, the second pixels may include a first second pixel, a second second pixel, and a third second pixel, the second main light emitting device of the first second pixel, the second main light emitting device of the second second pixel, and the second main light emitting device of the third second pixel may disposed at vertices of imaginary triangles in the second unit pixel area, and the second auxiliary light emitting device of the first second pixel, the second auxiliary light emitting device of the second second pixel, and the second auxiliary light emitting device of the third second pixel may be disposed at vertices of imaginary triangles in the first unit pixel area.

In an embodiment, the light blocking member may block a portion of light emitted from the first main light emitting device and the first auxiliary light emitting device traveling in a first direction and block a portion of light emitted from the second main light emitting device and the second auxiliary light emitting device traveling in a second direction opposite to the first direction.

In an embodiment, the light blocking member may surround each of the first main light emitting device and the second auxiliary light emitting device in a plan view, a first distance between an edge of the first main light emitting device in the first direction from a center thereof and the light blocking member may be less than a second distance between an edge of the first main light emitting device in the second direction from the center thereof and the light blocking member, and a third distance between an edge of the second auxiliary light emitting device in the first direction from a center thereof and the light blocking member may be less than a fourth distance between an edge of the second auxiliary light emitting device in the second direction from the center thereof and the light blocking member.

In an embodiment, the light blocking member may surround each of the second main light emitting device and the first auxiliary light emitting device in a plan view, a fifth distance between an edge of the first auxiliary light emitting device in the first direction from a center thereof and the light blocking member may be less than a sixth distance between an edge of the first auxiliary light emitting device in the second direction from the center thereof and the light blocking member, and a seventh distance between an edge of the second main light emitting device in the first direction from a center thereof and the light blocking member may be less than an eighth distance between an edge of the second main light emitting device in the second direction from the center thereof and the light blocking member.

A display device according to an embodiment includes a display panel including a plurality of first pixels which emit light of different colors from each other, a plurality of second pixels which emit light of different colors from each other, and a light blocking member disposed on the first pixels and the second pixels, where the light blocking member blocks a portion of light emitted from the first pixels and a portion of light emitted from the second pixels, a gate driver which provides a gate signal to the display panel, a data driver which provides a data voltage to the display panel, and an emission driver which provides an emission signal to the display panel. In such an embodiment, each of the first pixels includes a second pixel circuit, a second main light emitting device electrically connected to the second pixel circuit, and a second auxiliary light emitting device which emits light of a same color as the second main light emitting device and is electrically connected to the second main light emitting device. In such an embodiment, the first main light emitting device and the second auxiliary light emitting device are disposed in a first unit pixel area, and the second main light emitting device and the first auxiliary light emitting device are disposed in a second unit pixel area adjacent to the first unit pixel area.

In an embodiment, an operation of the first main light emitting device and an operation of the first auxiliary light emitting device may be controlled together by the first pixel circuit and an operation of the second main light emitting device and an operation of the second auxiliary light emitting device may be controlled together by the second pixel circuit.

In an embodiment, the display device may further include a data line which transmits the data voltage to the first pixels and the second pixels, a first transmission line electrically connected to the first auxiliary light emitting device and the first main light emitting device and disposed in a same layer as the data line, and a second transmission line electrically connected to the second auxiliary light emitting device and the second main light emitting device and disposed in a same layer as the data line.

In an embodiment, the first transmission line and the second transmission line may include a transparent conductive oxide.

In an embodiment, the light blocking member may block a portion of light emitted from the first main light emitting device and the first auxiliary light emitting device traveling in a first direction and a portion of light emitted from the second main light emitting device and the second auxiliary light emitting device traveling in a second direction opposite to the first direction.

The display panel according to embodiments may include first pixels, second pixels, and a light blocking member disposed on the first pixels and the second pixels. Each of the first pixels may include a first pixel circuit, a first main light emitting device connected to the first pixel circuit, and a first auxiliary light emitting device which emits light of a same color as the first main light emitting device, and is electrically connected to the first main light emitting device. Each of the second pixels may include a second pixel circuit, a second main light emitting device connected to the second pixel circuit, and a second auxiliary light emitting device which emits light of a same color as the second main light emitting device, and is electrically connected to the second main light emitting device. Accordingly, an operation of the first main light emitting device and an operation of the first auxiliary light emitting device may be controlled together by the first pixel circuit, and an operation of the second main light emitting device and an operation of the second auxiliary light emitting device may be controlled together by the second pixel circuit.

In such embodiments, the light blocking member may block a portion of the light emitted from the first main light emitting device and the first auxiliary light emitting device traveling in a first direction and a portion of the light emitted from the second main light emitting device and the first auxiliary light emitting device traveling in the second direction. In such embodiments, the display panel may have a first unit pixel area and a second unit pixel area adjacent to each other, the first main light emitting device and the second auxiliary light emitting device may be disposed in the first unit pixel area, and the second main light emitting device and the first auxiliary light emitting element may be disposed in the second unit pixel area. Accordingly, even when an image is displayed at a narrow viewing angle in which a viewing angle in a specific direction is limited, a resolution of the display panel may not deteriorate.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
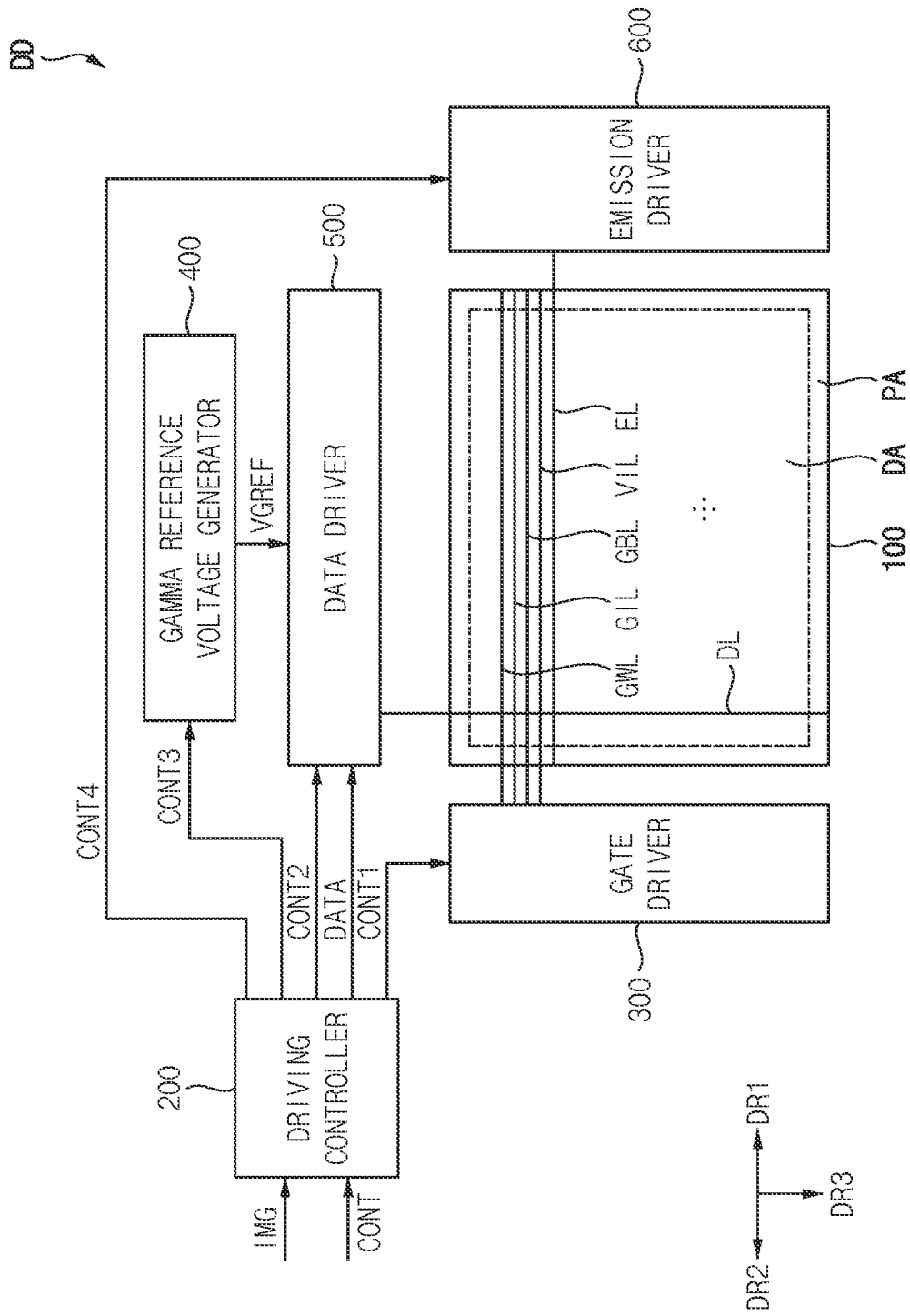
FIG. 1 is a schematic block diagram of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic block diagram of a display device according to an embodiment.

Referring to FIG. 1, a display device DD according to an embodiment may include a display panel 100 and a panel driver. The panel driver may include a driving controller 200, a gate driver 300, a gamma reference voltage generator 400, a data driver 500, and an emission driver 600.

The display panel 100 may include a display area DA for displaying an image and a peripheral area PA disposed adjacent to the display area DA.

The display panel 100 may include a plurality of gate lines GWL, GIL, and GBL, a plurality of data lines DL, a plurality of emission lines EL, and a plurality of pixels. The pixels may be electrically connected to gate lines GWL, GIL, and GBL, the data lines DL, and the emission lines EL, respectively. In an embodiment, for example, each of the gate lines GWL, GIL, and GBL and the emission lines EL may extend in a first direction DR1 (or in a second direction DR2 opposite to the first direction DR1). Each of the data lines DL may extend in a third direction DR3 crossing the first direction DR1.

In an embodiment, the display panel 100 may further include initialization lines VIL which transmits an initialization signal to the pixels. In an embodiment, for example, each of the initialization lines VIL may extend in the first direction DR1.

The driving controller 200 may receive an input image data IMG and an input control signal CONT from an external device (not shown). In an embodiment, for example, the input image data IMG may include red image data, green image data, and blue image data. The input image data IMG may further include white image data. Alternatively, the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, a fourth control signal CONT4, and a data signal DATA based on the input image data IMG and the input control signal CONT.

The driving controller 200 may generate the first control signal CONT1 which controls an operation of the gate driver 300 based on the input control signal CONT. The driving controller 200 may output the first control signal CONT1 to the gate driver 300. The first control signal CONT1 may include a vertical start signal and a gate clock signal.

The driving controller 200 may generate the second control signal CONT2 which controls an operation of the data driver 500 based on the input control signal CONT. The driving controller 200 may output the second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The drive controller 200 may generate the third control signal CONT3 which controls an operation of the gamma reference voltage generator 400 based on the input control signal CONT. The driving controller 200 may output the third control signal COTN3 to the gamma reference voltage generator 400.

The driving controller 200 may generate the fourth control signal CONT4 which controls an operation of the emission driver 600 based on the input control signal CONT. The driving controller 200 may output the fourth control signal CONT4 to the emission driver 600.

The gate driver 300 may generate gate signals which drive the gate lines GWL, GIL, and GBL in response to the first control signal CONT1 received from the driving controller 200. The gate driver 300 may output the gate signals to the gate lines GWL, GIL, and GBL.

In an embodiment, the gate driver 300 may generate initialization signals which drive the initialization lines VIL in response to the first control signal CONT1 received from the driving controller 200. The gate driver 300 may output the initialization signals to initialization lines VIL.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to each data signal DATA.

In an embodiment, for example, the gamma reference voltage generator 400 may be disposed in the driving controller 200 or in the data driver 500.

The data driver 500 may receive the second control signal CONT2 and the data signal DATA from the driving controller 200 and receive the gamma reference voltage VGREF from the gamma reference voltage generator 400. The data driver 500 may convert the data signal DATA into an analog data voltage using the gamma reference voltage VGREF. The data driver 500 may output the data voltage to the data line DL.

The emission driver 600 may generate emission signals which drive the emission lines EL in response to the fourth control signal CONT4 received from the driving controller 200. The emission driver 600 may output the emission signals to emission lines EL.

Figure 2:
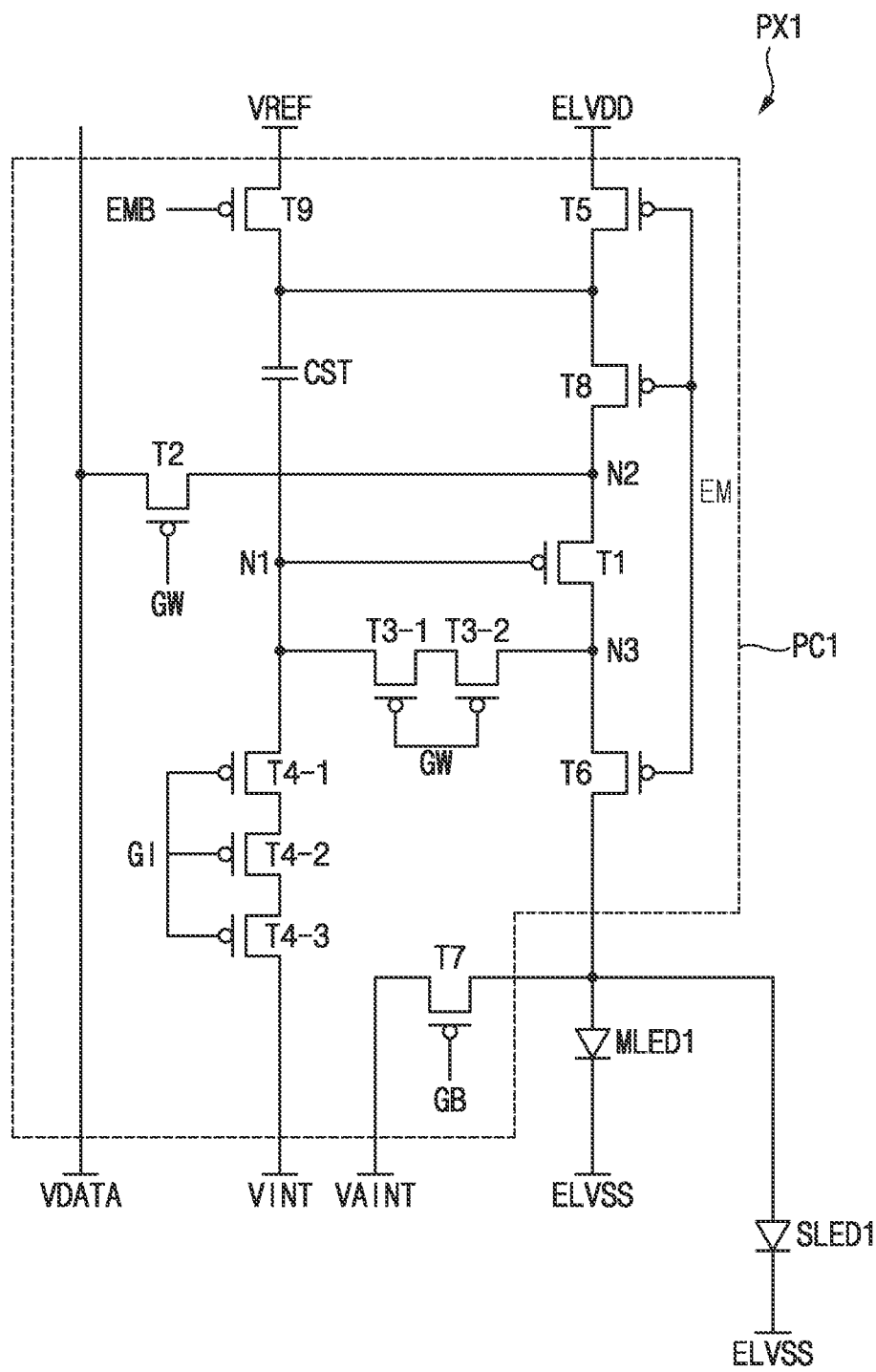
FIG. 2 is a circuit diagram illustrating a first pixel included in the display device of FIG. 1.

FIG. 2 is a circuit diagram illustrating a first pixel included in the display device of FIG. 1.

Referring to FIGS. 1 and 2, each of the first pixels PX1 included in the display panel 100 may include a first pixel circuit PC1, a first main light emitting device MLED1, and a first auxiliary light emitting device SLED1. The first pixel circuit PC1 may provide a driving current to the first main light emitting device MLED1 and the first auxiliary light emitting device SLED1. The first main light emitting device MLED1 and the first auxiliary light emitting device SLED1 may emit light of a same color based on the driving current.

In an embodiment, the first pixel circuit PC1 may include first to ninth transistors T1, T2, T3, T4, T5, T6, T7, T8, and T9 and a storage capacitor CST. However, a structure of the first pixel circuit PC1 shown in FIG. 2 is only an example, and the invention is not limited thereto.

The first transistor T1 may include a gate electrode connected to a first node N1, a first electrode connected to a second node N2, and a second electrode connected to a third node N3.

The second transistor T2 may include a gate electrode to which a data write gate signal GW is applied, a first electrode to which a data voltage VDATA is applied, and a second electrode connected to the second node N2.

The third transistor T3 may include a gate electrode to which the data write gate signal GW is applied, a first electrode connected to the first node N1, and a second electrode connected to the third node N3. In an embodiment, the third transistor T3 may include a first third transistor T3-1 and a second third transistor T3-2, which are connected to each other in series. That is, the third transistor T3 may have a dual-gate structure.

The fourth transistor T4 may include a gate electrode to which a data initialization gate signal GI is applied, a first electrode to which a first initialization signal VINT is applied, and a second electrode connected to the first node N1. In an embodiment, the fourth transistor T4 may include a first fourth transistor T4-1, a second fourth transistor T4-2, and a third fourth transistor T4-3, which are connected to each other in series. That is, the fourth transistor T4 may have a triple-gate structure.

The fifth transistor T5 may include a gate electrode to which a first emission signal EM is applied, a first electrode to which a high power supply voltage ELVDD is applied, and a second electrode connected to a first electrode of the eighth transistor T8.

The sixth transistor T6 may include a gate electrode to which the first emission signal EM is applied, a first electrode connected to the third node N3, and a second electrode connected to a first electrode (e.g., a first main pixel electrode) of the first main light emitting device MLED1 and a first electrode (e.g., a first auxiliary electrode) of the first auxiliary light emitting device SLED1.

The seventh transistor T7 may include a gate electrode to which a light emitting device initialization gate signal GB is applied, a first electrode to which a second initialization signal VAINT is applied, and a second electrode connected to the first electrode of the first main light emitting device MLED1 and the first electrode of the first auxiliary light emitting device SLED1.

The eighth transistor T8 may include a gate electrode to which the first emission signal EM is applied, a first electrode connected to the second electrode of the fifth transistor T5, and the second electrode connected to the second node N2.

The ninth transistor T9 may include a gate electrode to which a second emission signal EMB is applied, a first electrode to which a reference voltage VREF is applied, and a second electrode connected to a first electrode of the storage capacitor CST.

The storage capacitor CST may include the first electrode connected to the second electrode of the ninth transistor T9 and a second electrode connected to the first node N1.

The first main light emitting device MLED1 may include the first electrode and a second electrode (e.g., a common electrode) to which a low power supply voltage ELVSS is applied. An operation of the first main light emitting device MLED1 may be controlled by the first pixel circuit PC1. The first auxiliary light emitting device SLED1 may include the first electrode and a second electrode (e.g., the common electrode) to which the low power supply voltage ELVSS is applied. An operation of the first auxiliary light emitting device SLED1 may be controlled by the first pixel circuit PC1. That is, the operation of the first main light emitting device MLED1 and the operation of the first auxiliary light emitting device SLED1 may be controlled together by the first pixel circuit PC1. In an embodiment, the first electrode of the first auxiliary light emitting device SLED1 may be electrically connected to the first pixel circuit PC1 through a separate transmission line. This will be described later in greater detail with reference to FIGS. 10 to 21.

Figure 3:
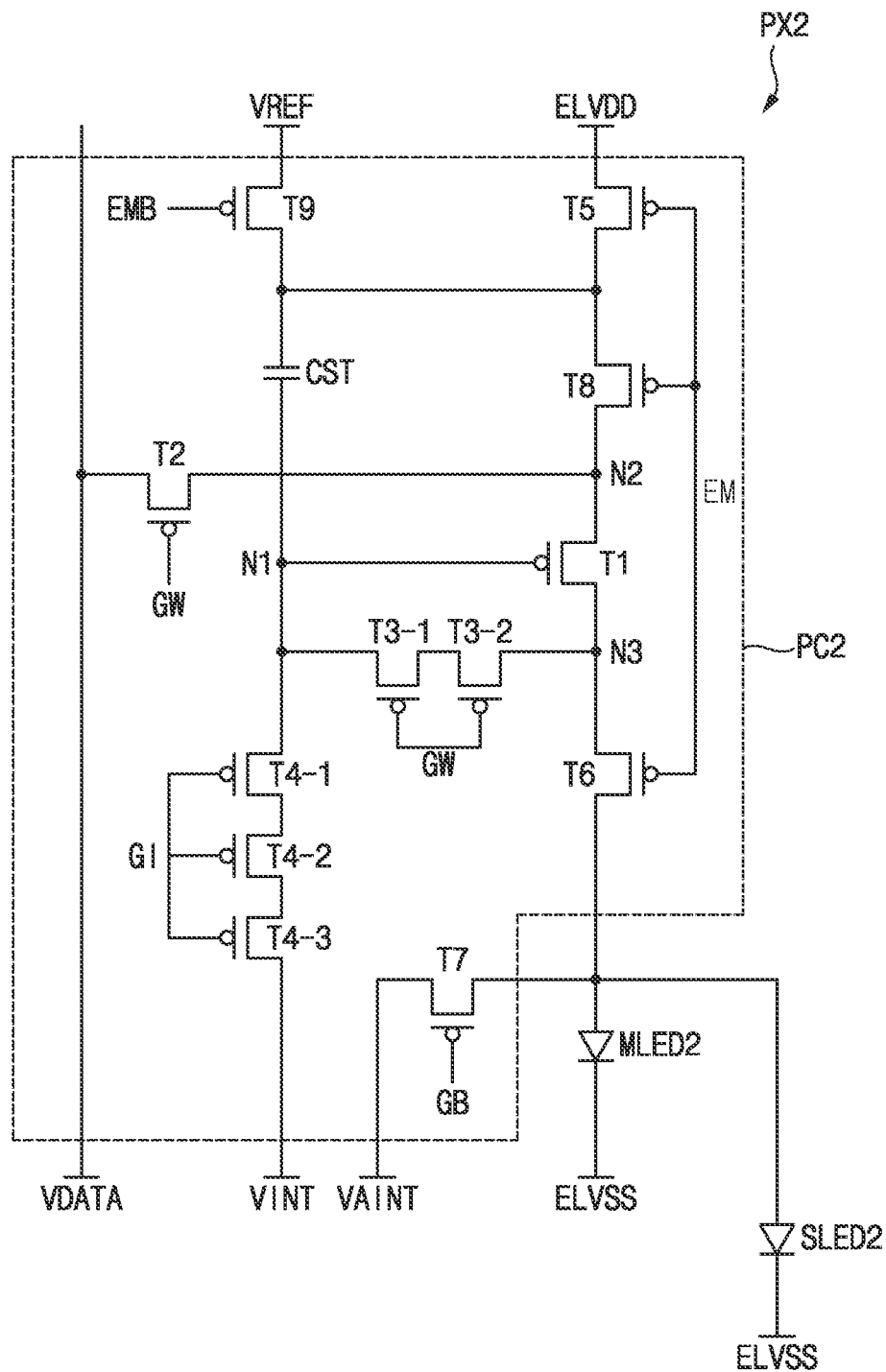
FIG. 3 is a circuit diagram illustrating a second pixel included in the display device of FIG. 1.

FIG. 3 is a circuit diagram illustrating a second pixel included in the display device of FIG. 1.

Referring to FIGS. 1 and 3, each of the second pixels PX2 included in the display panel 100 may include a second pixel circuit PC2, a second main light emitting device MLED2, and a second auxiliary light emitting device SLED2. The second pixel circuit PC2 may provide a driving current to the second main light emitting device MLED2 and the second auxiliary light emitting device SLED2. The second main light emitting device MLED2 and the second auxiliary light emitting device SLED2 may emit light of a same color based on the driving current.

A circuit structure of the second pixel circuit PC2 may be the same as a circuit structure of the first pixel circuit PC1 described with reference to FIG. 2, a structure of the second main light emitting device MLED2 may be same as a structure of the main light emitting device MLED1 described with reference to FIG. 2, and a structure of the second auxiliary light emitting device SLED2 may be the same as a structure of the first auxiliary light emitting device SLED1 described with reference to FIG. 2. Therefore, any repetitive detailed description thereof will be omitted.

An operation of the second main light emitting device MLED2 may be controlled by the second pixel circuit PC2. An operation of the second auxiliary light emitting device SLED2 may be controlled by the second pixel circuit PC2. That is, the operation of the second main light emitting device MLED2 and the operation of the second auxiliary light emitting device SLED2 may be controlled together by the second pixel circuit PC2. In an embodiment, a first electrode (e.g., the second auxiliary pixel electrode) of the second auxiliary light emitting device SLED2 may be electrically connected to the second pixel circuit PC2 through a separate transmission line. This will be described later in greater detail with reference to FIGS. 10 to 21.

Figure 4:
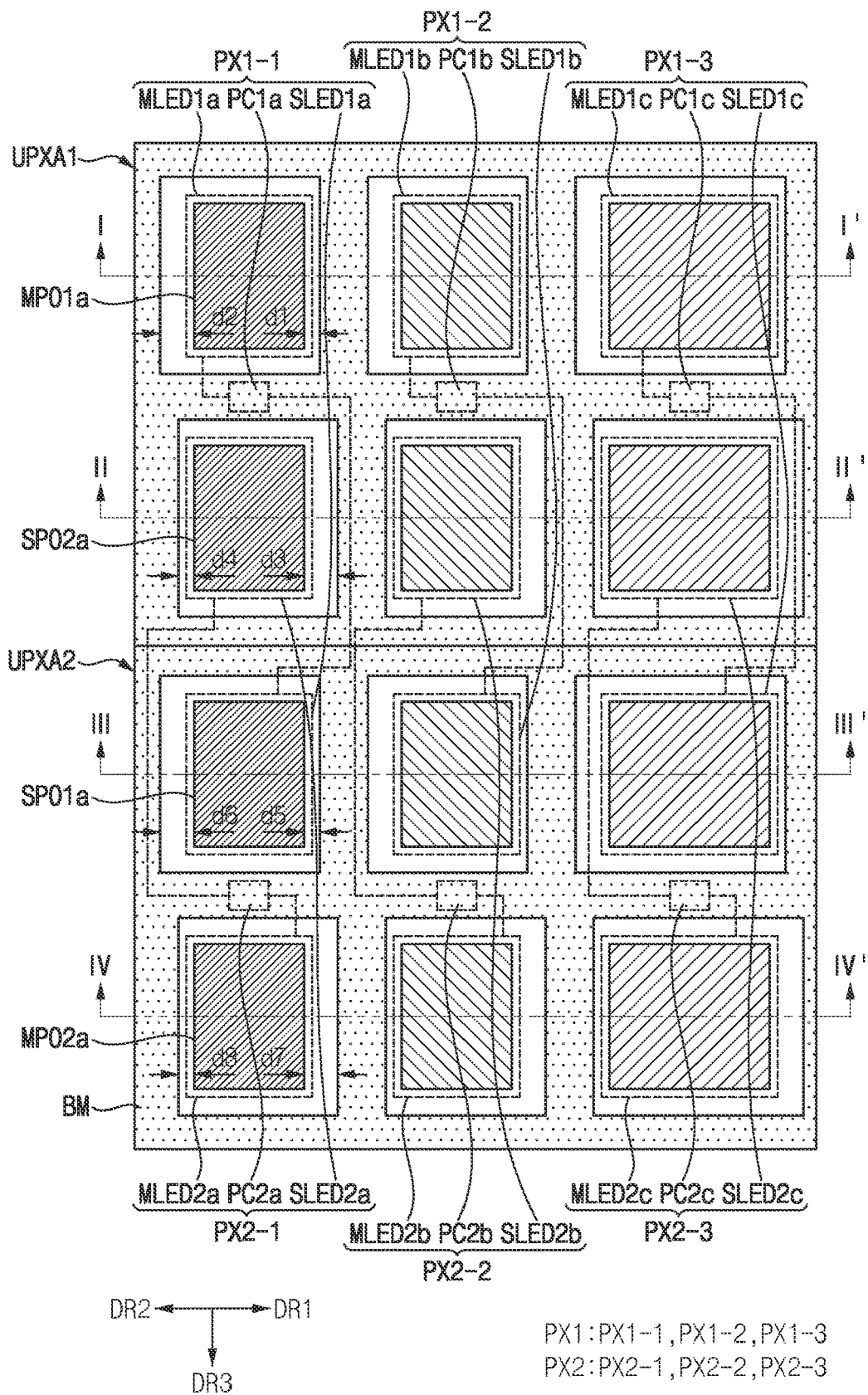
FIG. 4 is a plan view schematically illustrating first pixels, second pixels, and a light blocking member included in the display device of FIG. 1 according to an embodiment.
Figure 5:
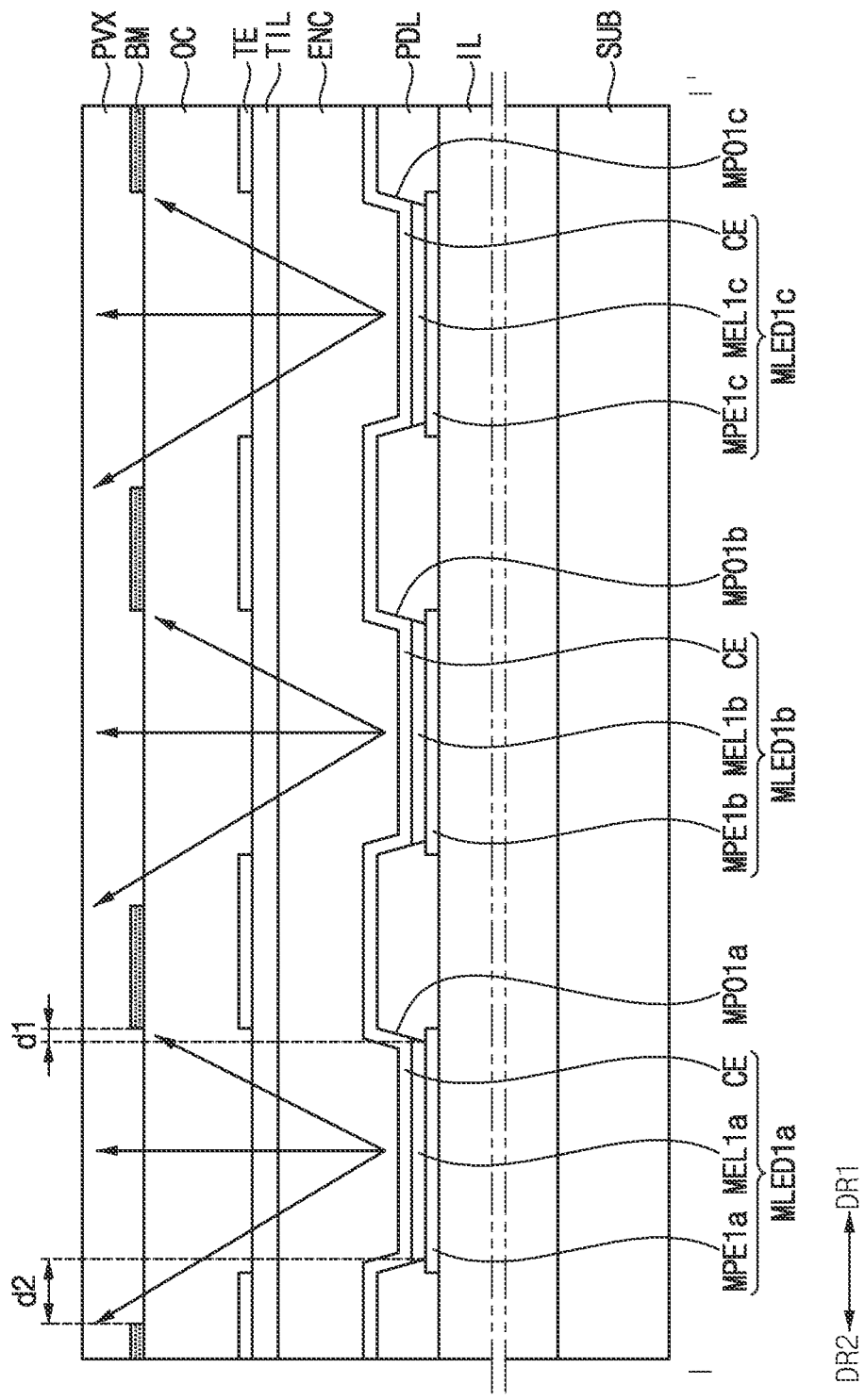
FIG. 5 is a cross-sectional view taken along line I-I' of FIG. 4.
Figure 6:
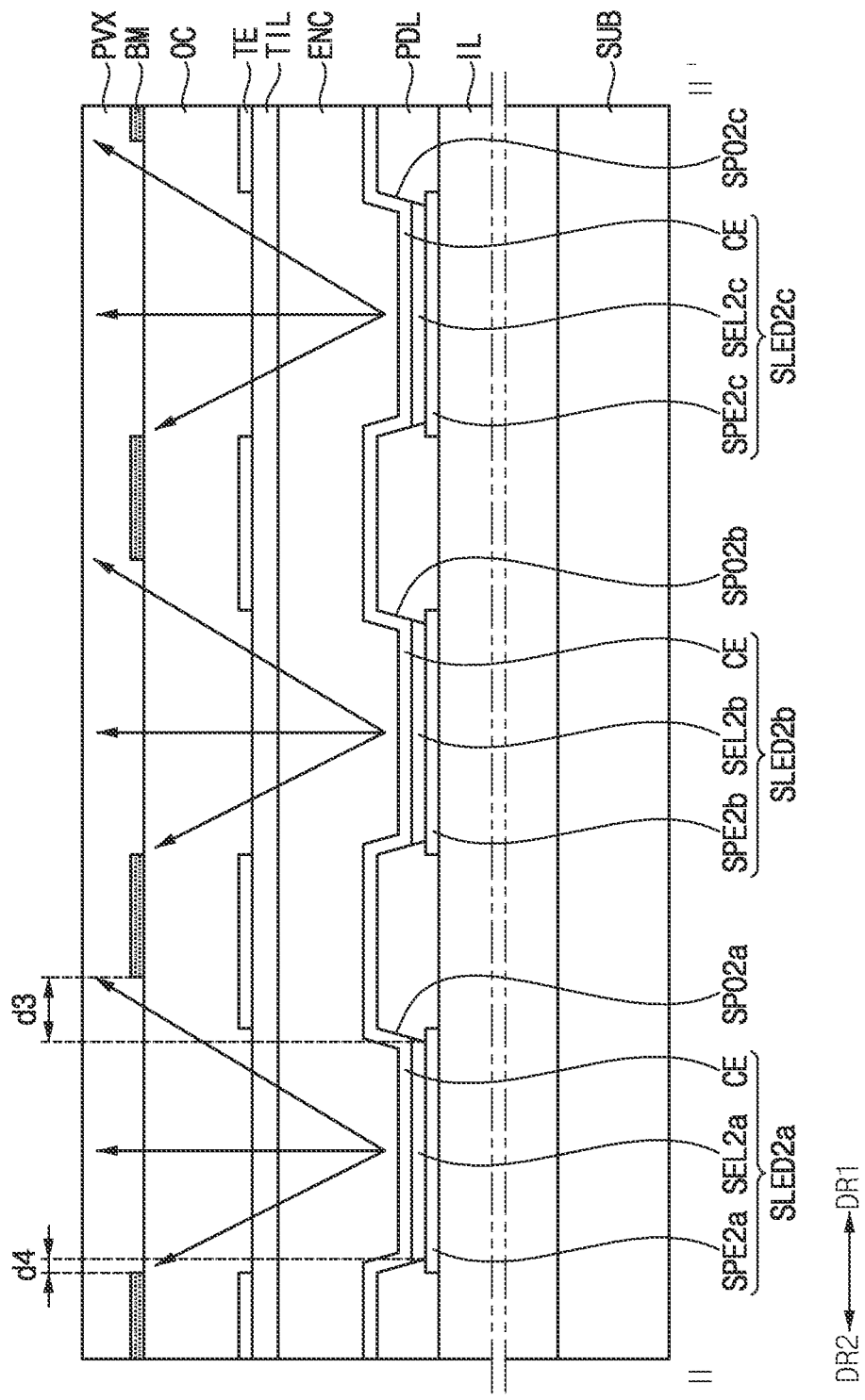
FIG. 6 is a cross-sectional view taken along line of FIG. 4.
Figure 7:
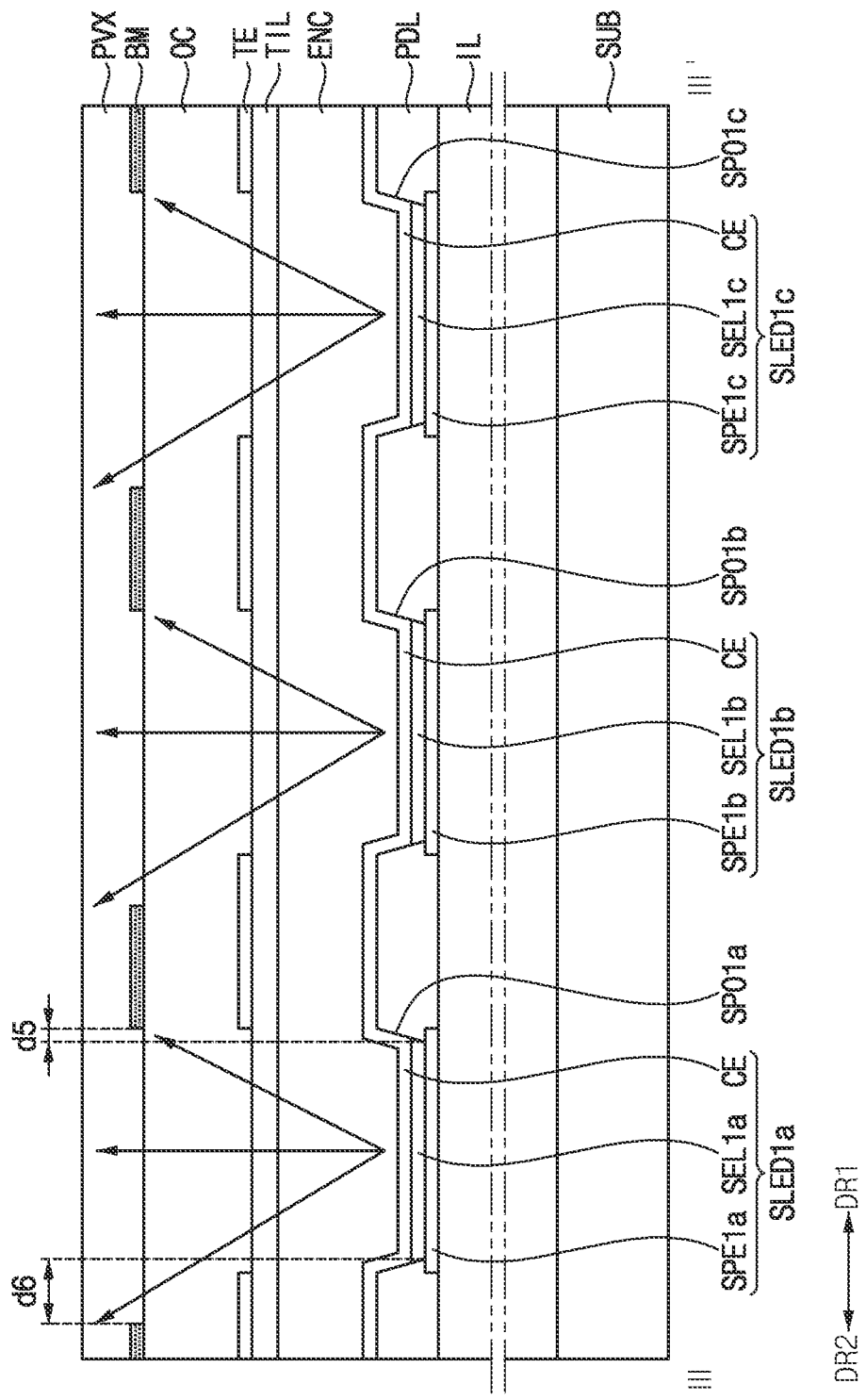
FIG. 7 is a cross-sectional view taken along line III-III' of FIG. 4.
Figure 8:
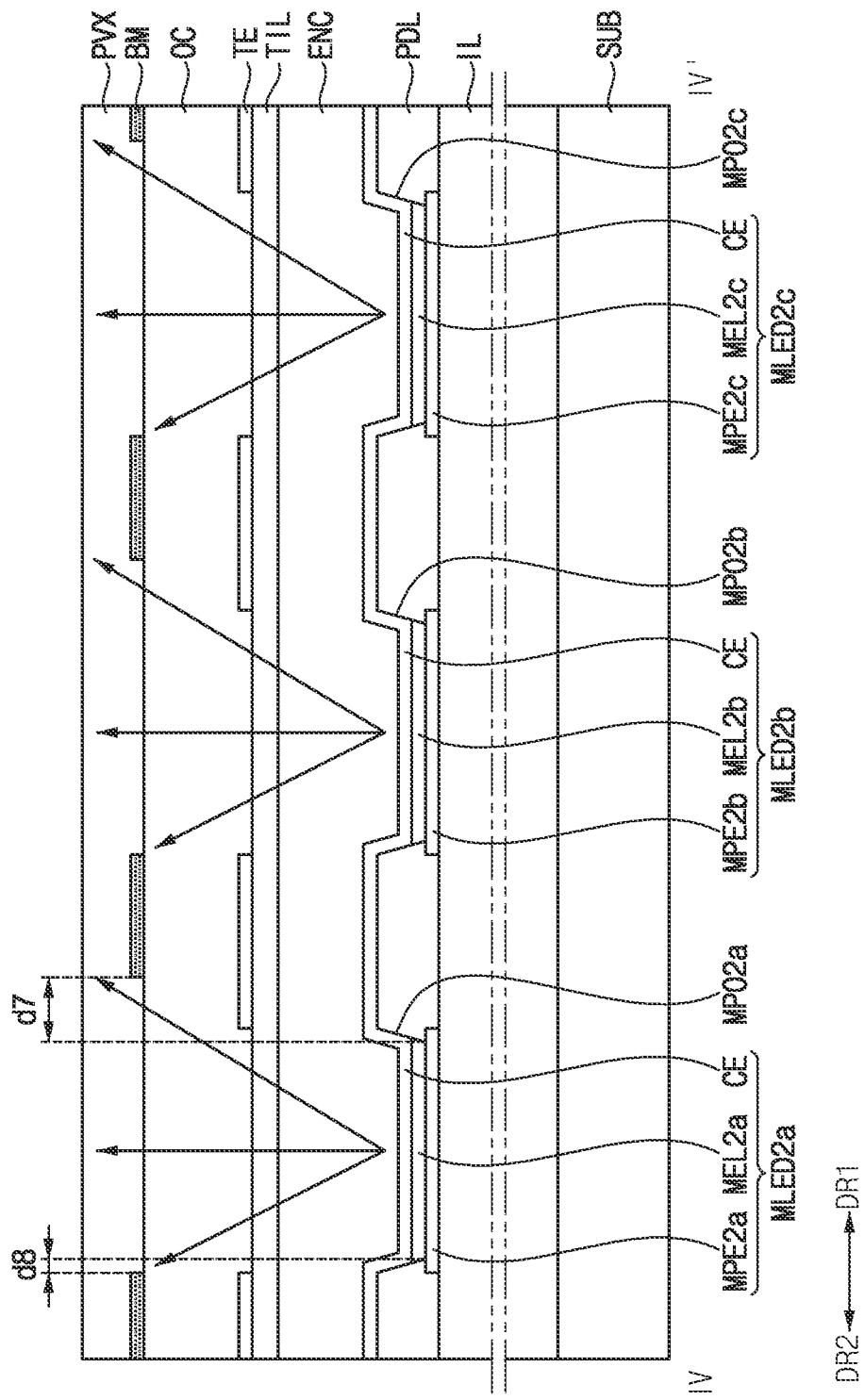
FIG. 8 is a cross-sectional view taken along line IV-IV' of FIG. 4.

FIG. 4 is a plan view schematically illustrating first pixels, second pixels, and a light blocking member included in the display device of FIG. 1 according to an embodiment. FIG. 5 is a cross-sectional view taken along line I-I' of FIG. 4. FIG. 6 is a cross-sectional view taken along line of FIG. 4. FIG. 7 is a cross-sectional view taken along line of FIG. 4. FIG. 8 is a cross-sectional view taken along line IV-IV' of FIG. 4.

Referring to FIGS. 1 to 8, an embodiment of the display panel 100 may include a substrate SUB, the first pixels PX1, the second pixels PX2, an insulating structure IL, a pixel defining layer PDL, an encapsulation layer ENC, a touch insulating layer TIL, a touch electrode layer TE, an overcoat layer OC, a light blocking member BM, and a passivation layer PVX.

The substrate SUB may be an insulating substrate including or formed of a transparent or opaque material. In an embodiment, the substrate SUB may include glass. In such an embodiment, the display panel 100 may be a rigid display panel. In an alternative embodiment, the substrate SUB may include plastic or a chemically reinforced thin-glass. In such an embodiment, the display panel 100 may be a flexible display panel.

The first pixels PX1 may be disposed on the substrate SUB. The first pixels PX1 may include a first first pixel PX1-1, a second first pixel PX1-2, and a third first pixel PX1-3 which emit light of different colors from each other. The first first pixel PX1-1 may emit light of a first color, the second first pixel PX1-2 may emit light of a second color, and the third first pixel PX1-3 may emit light of a third color. In an embodiment, for example, the first color may be red, the second color may be green, and the third color may be blue, but the invention is not limited thereto. In an embodiment, for example, the circuit diagram of FIG. 2 may correspond to any one of the first first pixel PX1-1, the second first pixel PX1-2, and the third first pixel PX1-3 of FIG. 4.

The second pixels PX2 may be disposed on the substrate SUB. The second pixels PX2 may include a first second pixel PX2-1, a second second pixel PX2-2, and a third second pixel PX2-3 which emit light of different colors from each other. The first second pixel PX2-1 may emit light of a first color, the second second pixel PX2-2 may emit light of a second color, and the third second pixel PX2-3 may emit light of a third color. In an embodiment, for example, the first color may be red, the second color may be green, and the third color may be blue, but the invention is not limited thereto. In an embodiment, for example, the circuit diagram of FIG. 3 may correspond to any one of the first second pixel PX2-1, second second pixel PX2-2, and third second pixel PX2-3 of FIG. 4.

The first first pixel PX1-1 may include a first pixel circuit PC1a, a first main light emitting device MLED1a and a first auxiliary light emitting device SLED1a. The first pixel circuit PC1a may provide the driving current to the first main light emitting device MLED1a and the first auxiliary light emitting device SLED1a.

As shown in FIG. 5, the first main light emitting device MLED1a of the first first pixel PX1-1 may include a main pixel electrode MPE1a, a main emission layer MEL1a, and the common electrode CE. The first main light emitting device MLED1a may be electrically connected to the first pixel circuit PC1a and emit light of the first color (e.g., red light). As shown in FIG. 7, the first auxiliary light emitting device SLED1a of the first first pixel PX1-1 may include an auxiliary pixel electrode SPE1a, an auxiliary emission layer SEL1a, and the common electrode CE. The first auxiliary light emitting element SLED1a may be electrically connected to the first pixel circuit PC1a and emit light of the first color (e.g., red light).

The second first pixel PX1-2 may include a first pixel circuit PC1b, a first main light emitting device MLED1b, and a first auxiliary light emitting device SLED1b. The first pixel circuit PC1b may provide the driving current to the first main light emitting device MLED1b and the first auxiliary light emitting device SLED1b.

As shown in FIG. 5, the first main light emitting device MLED1b of the second first pixel PX1-2 may include a main pixel electrode MPE1b, a main emission layer MEL1b, and the common electrode CE. The first main light emitting device MLED1b may be electrically connected to the first pixel circuit PC1b and emit light of the second color (e.g., green light). As shown in FIG. 7, the first auxiliary light emitting device SLED1b of the second first pixel PX1-2 may include an auxiliary pixel electrode SPE1b, an auxiliary emission layer SEL1b, and the common electrode CE. The first auxiliary light emitting device SLED1b may be electrically connected to the first pixel circuit PC1b and emit light of the second color (e.g., green light).

The third first pixel PX1-3 may include a first pixel circuit PC1c, a first main light emitting device MLED1c and a first auxiliary light emitting device SLED1c. The first pixel circuit PC1c may provide the driving current to the first main light emitting device MLED1c and the first auxiliary light emitting device SLED1c.

As shown in FIG. 5, the first main light emitting device MLED1c of the third first pixel PX1-3 may include a main pixel electrode MPE1c, a main emission layer MEL1c, and the common electrode CE. The first main light emitting device MLED1c may be electrically connected to the first pixel circuit PC1c and emit light of the third color (e.g., blue light). As shown in FIG. 7, the first auxiliary light emitting device SLED1c may include an auxiliary pixel electrode SPE1c, an auxiliary emission layer SEL1c, and the common electrode CE. The first auxiliary light emitting device SLED1c may be electrically connected to the first pixel circuit PC and emit light of the third color (e.g., blue light).

The first second pixel PX2-1 may include a second pixel circuit PC2a, a second main light emitting device MLED2a, and a second auxiliary light emitting device SLED2a. The second pixel circuit PC2a may provide the driving current to the second main light emitting device MLED2a and the second auxiliary light emitting device SLED2a.

As shown in FIG. 6, the second auxiliary light emitting device SLED2a of the first second pixel PX2-1 may include an auxiliary pixel electrode SPE2a, an auxiliary emission layer SEL2a, and the common electrode CE. The second auxiliary light emitting device SLED2a may be electrically connected to the second pixel circuit PC2a and emit light of the first color (e.g., red light). As shown in FIG. 8, the second main light emitting device MLED2a of the first second pixel PX2-1 may include a main pixel electrode MPE2a, a main emission layer MEL2a, and the common electrode CE. The second main light emitting device MLED2a may be electrically connected to the second pixel circuit PC2a and emit light of the first color (e.g., red light).

The second second pixel PX2-2 may include a second pixel circuit PC2b, a second main light emitting device MLED2b, and a second auxiliary light emitting device SLED2b. The second pixel circuit PC2b may provide the driving current to the second main light emitting device MLED2b and the second auxiliary light emitting device SLED1b.

As shown in FIG. 6, the second auxiliary light emitting device SLED2b of the second second pixel PX2-2 may include an auxiliary pixel electrode SPE2b, an auxiliary emission layer SEL2b, and the common electrode CE. The second auxiliary light emitting device SLED2b may be electrically connected to the second pixel circuit PC2b and emit light of the second color (e.g., green light). As shown in FIG. 8, the second main light emitting device MLED2b of the second second pixel PX2-2 may include a main pixel electrode MPE2b, a main emission layer MEL2b, and the common electrode CE. The second main light emitting device MLED2b may be electrically connected to the second pixel circuit PC2b and emit light of the second color (e.g., green light).

The third second pixel PX2-3 may include a second pixel circuit PC2c, a second main light emitting device MLED2c, and a second auxiliary light emitting device SLED2c. The second pixel circuit PC2c may provide the driving current to the second main light emitting device MLED2c and the second auxiliary light emitting device SLED1c.

As shown in FIG. 6, the second auxiliary light emitting device SLED2c of the third second pixel PX2-3 may include an auxiliary pixel electrode SPE2c, an auxiliary emission layer SEL2c, and the common electrode CE. The second auxiliary light emitting device SLED2c may be electrically connected to the second pixel circuit PC2c and emit light of the third color (e.g., blue light). As shown in FIG. 8, the second main light emitting device MLED2c of the third second pixel PX2-3 may include a main pixel electrode MPE2c, a main emission layer MEL2c, and the common electrode CE. The second main light emitting device MLED2c may be electrically connected to the second pixel circuit PC2c and emit light of the third color (e.g., blue light).

In an embodiment, the display panel 100 may include a plurality of first unit pixel areas UPXA1 and a plurality of second unit pixel areas UPXA2. The first unit pixel areas UPXA1 and the second unit pixel areas UPXA2 may be defined in a matrix form along the first direction DR1 and the third direction DR3. In an embodiment, for example, the first unit pixel areas UPXA1 and the second unit pixel areas UPXA2 may be alternately arranged along rows and columns. In an embodiment, for example, one of the first unit pixel areas UPXA1 and one of the second unit pixel areas UPXA2 may be adjacent to each other.

In an embodiment, the first main light emitting devices MLED1a, MLED1b, and MLED1c adjacent to each other and second auxiliary light emitting devices SLED2a, SLED2b, and SLED2c adjacent to each other may be disposed in the first unit pixel area UPXA1. The second main light emitting devices MLED2a, MLED2b, and MLED2c adjacent to each other and first auxiliary light emitting devices SLED1a, SLED1b, and SLED1c adjacent to each other may be disposed in the second unit pixel area UPXA2.

In an embodiment, as shown in FIG. 4, the number of first main light emitting devices MLED1a, MLED1b, and MLED1c disposed in the first unit pixel area UPXA1 and the number of second auxiliary light emitting devices SELD2a, SELD2b, and SELD2c disposed in the first unit pixel area UPXA1 may be the same as each other. In addition, the number of second main light emitting devices MLED2a, MLED2b, and MLED2c disposed in the second unit pixel area UPXA2 and the number of the first auxiliary light emitting devices SELD1a, SELD1b, and SELD1c disposed in the second unit pixel area UPXA2 may be the same as each other. Although the number of each of the main light emitting devices and the auxiliary light emitting devices disposed in one unit pixel area is illustrated in FIG. 4 as three, the invention is not necessarily limited thereto.

In an embodiment, as shown in FIG. 4, in a plan view (e.g., in a top plan view or when viewed in a thickness direction of the display panel 100), the first main light emitting device MLED1a, the first main light emitting device MLED1b, and the first main light emitting device MLED1c may be sequentially disposed along the first direction DR1. That is, the first main light emitting device MLED1a, the first main light emitting device MLED1b, and the first main light emitting device MLED1c may be arranged in a line along the first direction DR1 in the first unit pixel area UPX1. The second auxiliary light emitting device SLED2a may be disposed in the third direction DR3 of the first main light emitting device MLED1a, and the second auxiliary light emitting device SLED2b may be disposed in the third direction DR3 of the first main light emitting device MLED2b, and the second auxiliary light emitting device SLED2c may be disposed in the third direction DR3 of the first main light emitting device MLED1c. That is, the second auxiliary light emitting device SLED2a, the second auxiliary light emitting device SLED2b, and the second auxiliary light emitting device SLED2c may be arranged in a line along the first direction DR1 in the first unit pixel area UPX1.

In an embodiment, as shown in FIG. 4, in a plan view, the first auxiliary light emitting device SLED1a, the first auxiliary light emitting device SLED1b, and the first auxiliary light emitting device SLED1c may be sequentially disposed along the first direction DR1. That is, the first auxiliary light emitting device SLED1a, the first auxiliary light emitting device SLED1b, and the first auxiliary light emitting device SLED1c may be arranged in a line along the first direction DR1 in the second unit pixel area UPX2. The second main light emitting device MLED2a may be disposed in the third direction DR3 of the first auxiliary light emitting device SLED1a, and the second main light emitting device MLED2b may be disposed in the third direction DR3 of the first auxiliary light emitting device SLED1b, and the second main light emitting device MLED2c may be disposed in the third direction DR3 of the first auxiliary light emitting device SLED1c. That is, the second main light emitting device MLED2a, the second main light emitting device MLED2b, and the second main light emitting device MLED2c may be arranged in a line along the first direction DR1 in the second unit pixel area UPX2.

In an embodiment, as described above, operations of the first main light emitting devices MLED1a, MLED1b, and MLED1c and operations of the first auxiliary light emitting devices SELD1a, SELD1b, and SELD1c may be controlled by the first pixel circuits PC1a, PC1b, and PC1c, respectively. In such an embodiment, operations of the second main light emitting devices MLED2a, MLED2b, and MLED2c and operations of the second auxiliary light emitting devices SELD2a, SELD2b, and SELD2c may be controlled by the second pixel circuits PC2a, PC2b, and PC2c, respectively.

The insulating structure IL may cover the first pixel circuits PC1a, PC1b, and PC1c and the second pixel circuits PC2a, PC2b, and PC2c. The insulating structure IL may include a combination of an inorganic insulating layer and an organic insulating layer.

The first main pixel electrodes MPE1a, MPE1b, and MPE1c, the second main pixel electrodes MPE2a, MPE2b, and MPE2c, the first auxiliary pixel electrodes SPE1a, SPE1b, and SPE1c, and the second auxiliary pixel electrodes SPE2a, SPE2b, and SPE2c may be disposed on the insulating structure IL. The first main pixel electrodes MPE1a, MPE1b, and MPE1c, the second main pixel electrodes MPE2a, MPE2b, and MPE2c, the first auxiliary pixel electrodes SPE1a, SPE1b, and SPE1c, and the second auxiliary pixel electrodes SPE2a, SPE2b, SPE2c may include a conductive material. The first main pixel electrodes MPE1a, MPE1b, and MPE1c, the second main pixel electrodes MPE2a, MPE2b, and MPE2c, the first auxiliary pixel electrodes SPE1a, SPE1b, and SPE1c, and the second auxiliary pixel electrodes SPE2a, SPE2b, SPE2c may be physically separated from each other.

The first main pixel electrode MPE1a and the first auxiliary pixel electrode SPE1a may be electrically connected to the first pixel circuit PC1a. In an embodiment, for example, the first main pixel electrode MPE1a may be electrically connected to the first pixel circuit PC1a through contact holes defined or formed in the insulating structure IL, and the first auxiliary pixel electrode SPE1a may be electrically connected to the first pixel circuit PC1a through a separate transmission line.

The first main pixel electrode MPE1b and the first auxiliary pixel electrode SPE1b may be electrically connected to the first pixel circuit PC1b. In an embodiment, for example, the first main pixel electrode MPE1b may be electrically connected to the first pixel circuit PC1b through contact holes defined or formed in the insulating structure IL, and the first auxiliary pixel electrode SPE1b may be electrically connected to the first pixel circuit PC1b through a separate transmission line.

The first main pixel electrode MPE1c and the first auxiliary pixel electrode SPE1c may be electrically connected to the first pixel circuit PC1c. In an embodiment, for example, the first main pixel electrode MPE1c may be electrically connected to the first pixel circuit PC1c through contact holes defined or formed in the insulating structure IL, and the first auxiliary pixel electrode SPE1c may be electrically connected to the first pixel circuit PC1b through a separate transmission line.

The second main pixel electrode MPE2a and the second auxiliary pixel electrode SPE1a may be electrically connected to the second pixel circuit PC2a. In an embodiment, for example, the second main pixel electrode MPE2a may be electrically connected to the second pixel circuit PC2a through contact holes defined or formed in the insulating structure IL, and the second auxiliary pixel electrode SPE2a may be electrically connected to the second pixel circuit PC2a through a separate transmission line.

The second main pixel electrode MPE2b and the second auxiliary pixel electrode SPE1a may be electrically connected to the second pixel circuit PC2b. In an embodiment, for example, the second main pixel electrode MPE2b may be electrically connected to the second pixel circuit PC2b through contact holes defined or formed in the insulating structure IL, and the second auxiliary pixel electrode SPE2b may be electrically connected to the second pixel circuit PC2b through a separate transmission line.

The second main pixel electrode MPE2c and the second auxiliary pixel electrode SPE1c may be electrically connected to the second pixel circuit PC2c. In an embodiment, for example, the second main pixel electrode MPE2c may be electrically connected to the second pixel circuit PC2c through contact holes defined or formed in the insulating structure IL, and the second auxiliary pixel electrode SPE2c may be electrically connected to the second pixel circuit PC2c through a separate transmission line.

The pixel defining layer PDL may be disposed on the first main pixel electrodes MPE1a, MPE1b, and MPE1c, the second main pixel electrodes MPE2a, MPE2b, and MPE2c, the first auxiliary pixel electrodes SPE1a, SPE1b, and SPE1c, and the second auxiliary pixel electrodes SPE2a, SPE2b, and SPE2c. The pixel defining layer PDL may include an organic insulating material. The pixel defining layer PDL may define first main pixel openings MPO1a, MPO1b, MPO1c exposing at least a portion of each of the first main pixel electrodes MPE1a, MPE1b, and MPE1c, second main pixel openings MPO2a, MPO2b, and MPO2c exposing at least a portion of each of the second main pixel electrodes MPE2a, MPE2b and MPE2c, first auxiliary pixel openings SPO1a, SPO1b, and SPO1c exposing at least a portion of each of the first auxiliary pixel electrodes SPE1a, SPE1b, and SPE1c, and second auxiliary pixel openings SPO2a, SPO2b, and SPO2c exposing at least a portion of each of the and the second auxiliary pixel electrodes SPE2a, SPE2b, and SPE2c.

In an embodiment, for example, the first main pixel openings MPO1a, MPO1b, and MPO1c and the second auxiliary pixel openings SPO2a, SPO2b, and SPO2c may be defined in the first unit pixel area UPXA1, and the second main pixel openings MPO2a, MPO2b, and MPO2c and the first auxiliary pixel openings SPO1a, SPO1b, and SPO1c may be defined in the second unit pixel area UPXA2.

The first and second main emission layers MEL1a and MEL2a which generate the first light of the first color (e.g., red light) may be disposed on the first and second main pixel electrodes MPE1a and MPE2a exposed by the first and second main pixel openings MPO1a and MPO2a, respectively. The first and second main emission layers MEL1b and MEL2b which generate the second light of the second color (e.g., green light) may be disposed on the first and second main pixel electrodes MPE1b and MPE2b exposed by the first and second main pixel openings MPO1b and MPO2b, respectively. The first and second main emission layers MEL1c and MEL2c which generate the third light of the third color (e.g., blue light) may be disposed on the first and second main pixel electrodes MPE1c and MPE2c exposed by the first and second main pixel openings MPO1c and MPO2c, respectively.

The first and second auxiliary emission layers SEL1a and SEL2a which generate the first light of the first color (e.g., red light) may be disposed on the first and second auxiliary pixel electrodes SPE1a and SPE2a exposed by the first and second auxiliary pixel openings SPO1a and SPO2a, respectively. The first and second auxiliary emission layers SEL1b and SEL2b which generate the second light of the second color (e.g., green light) may be disposed on the first and second auxiliary pixel electrodes SPE1b and SPE2b exposed by the first and second auxiliary pixel openings SPO1b and SPO2b, respectively. The first and second auxiliary emission layers SEL1c and SEL2c which generate the third light of the third color (e.g., blue light) may be disposed on the first and second auxiliary pixel electrodes SPE1c and SPE2c exposed by the first and second auxiliary pixel openings SPO1c and SPO2c, respectively.

The first main emission layers MEL1a, MEL1b, and MEL1c, the second main emission layers MEL2a, MEL2b, and MEL2c, the first auxiliary emission layers SEL1a, SEL1b, and SEL1c, and the second auxiliary emission layers SEL2a, SEL2b, and SEL2c may include at least one selected from an organic light emitting material and a quantum dot.

The common electrode CE including a conductive material may be disposed on the first main emission layers MEL1a, MEL1b, and MEL1c, the second main emission layers MEL2a, MEL2b, and MEL2c, the first auxiliary emission layers SEL1a, SEL1b, and SEL1c, and the second auxiliary emission layers SEL2a, SEL2b, and SEL2c. In an embodiment, the common electrode CE may continuously extend over a plurality of pixels and on the display area DA.

The encapsulation layer ENC may be disposed on the common electrode CE. The encapsulation layer ENC may include at least one inorganic encapsulation layer and at least one organic encapsulation layer.

The touch insulating layer TIL may be disposed on the encapsulation layer ENC. In an embodiment, for example, the touch insulating layer TIL may include an inorganic insulating material.

The touch electrode layer TE may be disposed on the touch insulating layer TIL. The touch electrode layer 1E, may include a conductive material. In an embodiment, for example, the touch electrode layer TE may be disposed not to overlap with the first main emission layers MEL1a, MEL1b, and MEL1c, the second main emission layers MEL2a, MEL2b, and MEL2c, the first auxiliary emission layers SEL1a, SEL1b, and SEL1c, and the second auxiliary emission layers SEL2a, SEL2b, and SEL2c. In an embodiment, for example, the touch electrode layer TE may include a first touch electrode layer, an inorganic insulating layer covering the first touch electrode layer, and a second touch electrode layer disposed on the inorganic insulating layer.

The overcoat layer OC may cover the touch electrode layer TE. In an embodiment, for example, the overcoat layer OC may include an organic insulating material.

The light blocking member BM may be disposed on the first pixels PX1 and the second pixels PX2 and block some (or a portion) of light emitted from the first pixels PX1 and the second pixels PX2 to adjust a viewing angle. In an embodiment, for example, the light blocking member BM may be disposed on the overcoat layer OC.

The light blocking member BM on the first unit pixel area UPXA1 may surround each of the first main light emitting device MLED1a and the second auxiliary light emitting device SLED2a, in a plan view. In an embodiment, as shown in FIGS. 4 and 5, a first distance d1 between an edge of the first main light emitting device MLED1a in the first direction DR1 from a center thereof (e.g., a right edge of the first main pixel opening MPO1a) and the light blocking member BM may be less than a second distance d2 between an edge of the first main light emitting device MLED1a in the second direction DR2 from the center thereof (e.g., a left edge of the first main pixel opening MPO1a) and the light blocking member BM, in a plan view. Accordingly, the light blocking member BM may block some of the light emitted from the first main light emitting device MLED1a traveling in the first direction DR1.

In an embodiment, as shown in FIGS. 4 and 6, a third distance d3 between an edge of the second auxiliary light emitting device SLED2a in the first direction DR1 from a center thereof (e.g., a right edge of the second auxiliary pixel opening SPO2a) and the light blocking member BM may be greater than a fourth distance d4 between an edge of the second auxiliary light emitting device SLED2a in the second direction DR2 from the center thereof (e.g., a left edge of the second auxiliary pixel opening SPO2a) and the light blocking member BM, in a plan view. Accordingly, the light blocking member BM may block some of the light emitted from the second auxiliary light emitting device SLED2a traveling in the second direction DR2.

Similarly, the light blocking member BM on the first unit pixel area UPXA1 may block some of the light emitted from each of the first main light emitting devices MLED1a, MLED1b, and MLED1c traveling in the first direction DR1, some of the light emitted from each of the second auxiliary light emitting devices SLED2a, SLED2b, and SLED2c traveling in the second direction DR2.

The light blocking member BM on the second unit pixel area UPXA2 may surround each of the second main light emitting device MLED2a and the first auxiliary light emitting device SLED1a, in a plan view. In an embodiment, as shown in FIGS. 4 and 7, a fifth distance d5 between an edge of the first auxiliary light emitting device SLED1a in the first direction DR1 from a center thereof (e.g., a right edge of the first auxiliary pixel opening SPO1a) and the light blocking member BM may be less than a sixth distance d6 between an edge of the first auxiliary light emitting device SLED1a in the second direction DR2 from the center thereof (e.g., a left edge of the first auxiliary pixel opening SPO1a) and the light blocking member BM, in a plan view. Accordingly, the light blocking member BM may block some of the light emitted from the first auxiliary light emitting device SLED1a traveling in the first direction DR1.

In an embodiment, as shown in FIGS. 4 and 8, a seventh distance d7 between an edge of the second main light emitting device MLED2a in the first direction DR1 from a center thereof (e.g., a right edge of the second main pixel opening MPO2a) and the light blocking member BM may be greater than an eighth distance d8 between an edge of the second main light emitting device MLED1a in the second direction DR2 from the center thereof (e.g., a left edge of the second main pixel opening MPO2a) and the light blocking member BM, in a plan view. Accordingly, the light blocking member BM may block some of the light emitted from the second main light emitting device MLED2a traveling in the second direction DR2.

Similarly, the light blocking member BM on the second unit pixel area UPXA2 may block some of the light emitted from each of the second main light emitting devices MLED2a, MLED2b, and MLED2c traveling in the second direction DR2 and some of the light emitted from each of the first auxiliary light emitting devices SLED1a, SLED1b, and SLED1c traveling in the first direction DR1.

In an embodiment, when displaying an image in a mode which limits the viewing angle in the first direction DR1, the first main light emitting devices MLED1a, MLED1b, and MLED1c and the first auxiliary light emitting devices SLED1a, SLED1b, and SLED1c may be turned on, and the second main light emitting devices MLED2a, MLED2b, and MLED2c and the second auxiliary light emitting devices SLED2a, SLED2b, and SLED2c may be turned off. The light blocking member BM may block some of the light emitted from each of the first main light emitting devices MLED1a, MLED1b, and MLED1c and the first auxiliary light emitting devices SLED1a, SLED1b, and SLED1c traveling in the first direction DR1. Accordingly, the image may not be viewed in the first direction DR1 of the display panel 100.

When an image is displayed in a mode in which the viewing angle in the second direction DR2 is limited, the second main light emitting devices MLED2a, MLED2b, and MLED2c and the second auxiliary light emitting devices SLED2a, SLED2b, and SLED2c may be turned on, and the first main light emitting devices MLED1a, MLED1b, and MLED1c and the first auxiliary light emitting devices SLED1a, SLED1b, and SLED1c may be turned off. The light blocking member BM may block some of the light emitted from each of the second main light emitting devices MLED2a, MLED2b, and MLED2c and the second auxiliary light emitting devices SLED2a, SLED2b, and SLED2c traveling in the second direction DR2. Accordingly, the image may not be viewed in the second direction DR2 of the display panel 100.

When displaying an image in a mode which does not limit the viewing angle, the first main light emitting devices MLED1a, MLED1b, and MLED1c, the first auxiliary light emitting devices SLED1a, SLED1b, and SLED1c, the second main light emitting devices MLED2a, MLED2b and MLED2c, and the second auxiliary light emitting devices SLED2a, SLED2b and SLED2c may all be turned on. Accordingly, the image may be viewed in both the first direction DR1 and the second direction DR2 of the display panel 100.

According to embodiments, the display panel 100 may display the image with a wide viewing angle or a narrow viewing angle in which a viewing angle in a specific direction is limited based on an input mode. Thus, user's privacy may be protected as desired. In such embodiments, resolution may not be reduced even when the image is displayed with a narrow viewing angle in which the viewing angle in a specific direction is limited.

Figure 9:
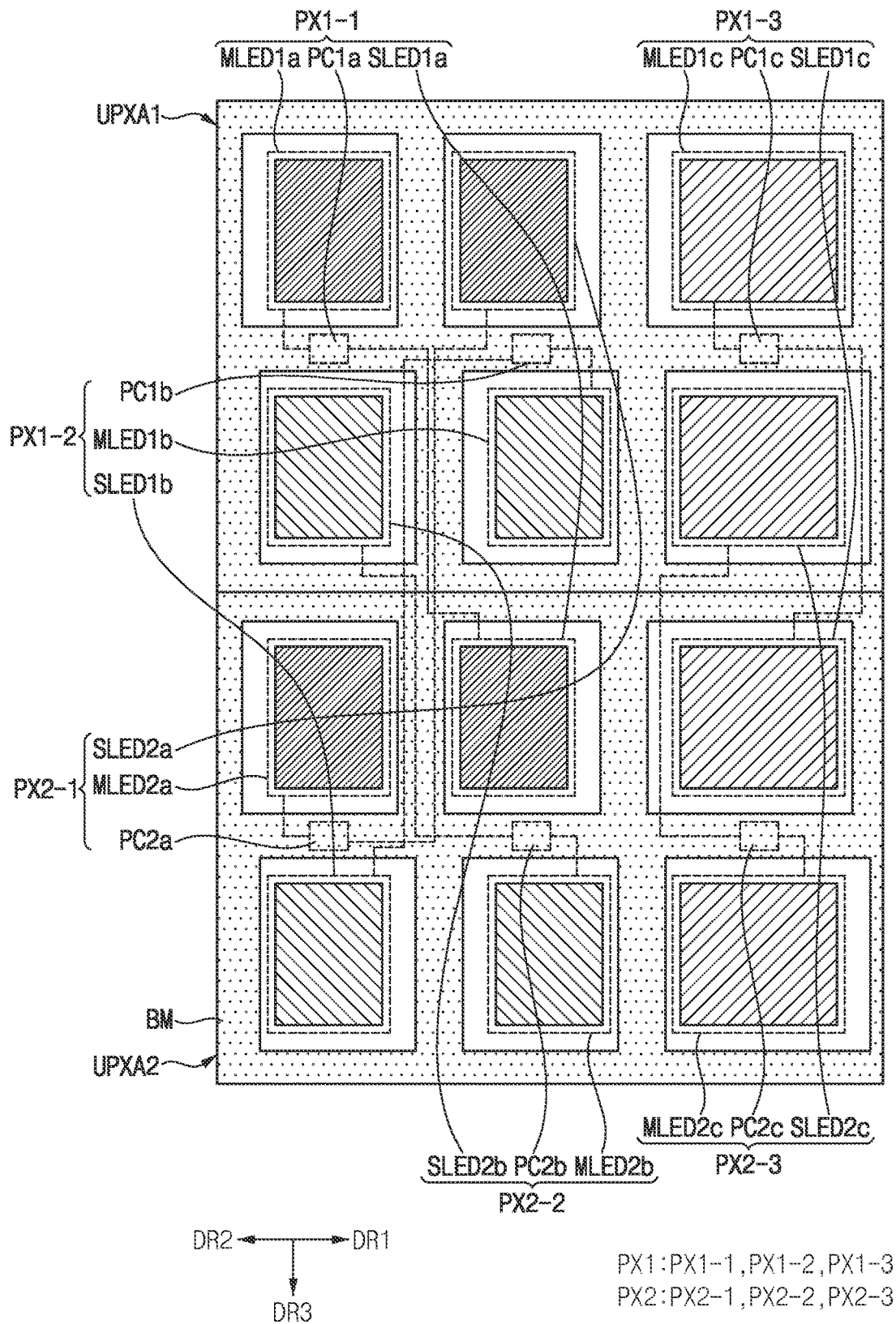
FIG. 9 is a plan view schematically illustrating first pixels, second pixels, and a light blocking member included in the display device of FIG. 1 according to an alternative embodiment.

FIG. 9 is a plan view schematically illustrating first pixels, second pixels, and a light blocking member included in the display device of FIG. 1 according to an alternative embodiment.

Referring to FIG. 9, in a plan view, the first main light emitting device MLED1a, the second auxiliary light emitting device SLED2a, and the first main light emitting device MLED1c may be sequentially disposed along the first direction DR1. The second auxiliary light emitting device SLED2b may be disposed in the third direction DR3 of the first main light emitting device MLED1a, the first main light emitting device MLED1b may disposed in the third direction DR3 of the second auxiliary light emitting device SLED2a, and the second auxiliary light emitting device SLED2c may be disposed in the third direction DR3 of the first main light emitting device MLED1c. That is, the first main light emitting devices MLED1a, MLED1b, and MLED1c may be disposed at vertices of an imaginary triangle in the first unit pixel area UPXA1. Also, the second auxiliary light emitting devices SLED2a, SLED2b, and SLED2c may be disposed at vertices of another imaginary triangle in the first unit pixel area UPXA1.

In an embodiment, as shown in FIG. 9, in a plan view, the second main light emitting device MLED2a, the first auxiliary light emitting device SLED1a, and the first auxiliary light emitting device SLED1c may be sequentially disposed along the first direction DR1. The first auxiliary light emitting device SLED1a may be disposed in the third direction DR3 of the second main light emitting device MLED2a, and the second main light emitting device MLED2b may be disposed in the third direction DR3 of the first auxiliary light emitting device SLED1a, and the second main light emitting device MLED2c may be disposed in the third direction DR3 of the first auxiliary light emitting device SLED1c. That is, the second main light emitting devices MLED2a, MLED2b, and MLED2c may be disposed at vertices of an imaginary triangle in the second unit pixel area UPXA2. Also, the first auxiliary light emitting devices SLED1a, SLED1b, and SLED1c may be disposed at vertices of another imaginary triangle in the second unit pixel area UPXA2.

An arrangement relationship of the first main light emitting devices MLED1a, MLED1b, and MLED1c, the first auxiliary light emitting devices SLED1a, SLED1b, and SLED1c, the second main light emitting devices MLED2a, MLED2b, and MLED2c, and the second auxiliary light emitting devices SLED2a, SLED2b, and SLED2c shown in FIG. 4 or 9 is only an example, and may be variously changed.

FIGS. 10 to 20 are plan views illustrating layers of a first pixel of FIG. 2 and a second pixel of FIG. 3. FIG. 21 is a cross-sectional view taken along line V-V' of FIG. 20.

Referring to FIGS. 21 and 10 to 20, in an embodiment, each of the first pixels PX1 and the second pixels PX2 included in the display panel 100 may include a substrate 110, an active layer 120, a first conductive layer 130, a second conductive layer 140, a third conductive layer 150, a fourth conductive layer 160, a fifth conductive layer 170, an emission layer, and a sixth conductive layer.

The substrate 110 may include a plurality of pixel circuit areas PCA, or the plurality of pixel circuit areas PCA may be defined on the substrate 110. The first pixel circuit PC1 or the second pixel circuit PC2 may be disposed in each of the pixel circuit areas PCA on the substrate 110. Each of the plurality of pixel circuit areas PCA may have substantially the same or similar arrangement structure as each other.

Figure 10:
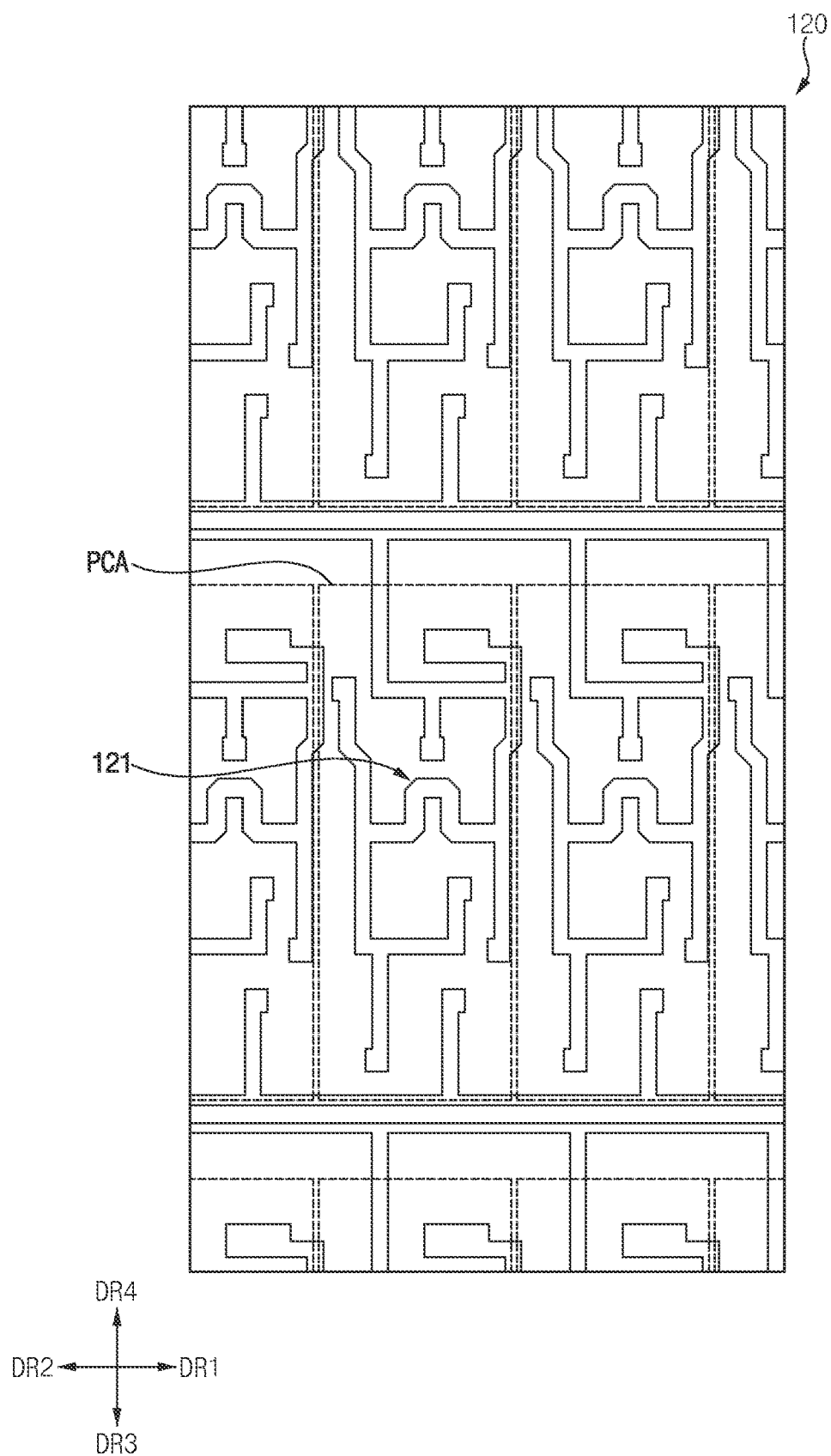
FIGS. 10 to 20 are plan views illustrating layers of a first pixel of FIG. 2 and a second pixel of FIG. 3.

Referring to FIGS. 21 and 10, the active layer 120 may be disposed on the substrate 110. The active layer 120 may include an active pattern 121 disposed in the pixel circuit area PCA. The active layer 120 may include an oxide semiconductor, a silicon semiconductor, or an organic semiconductor. In an embodiment, for example, the oxide semiconductor may include at least one selected from oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

In an embodiment, a buffer layer may be disposed between the substrate 110 and the active layer 120. The buffer layer may block diffusion of impurities such as oxygen and moisture into the active layer 120 through the substrate 110.

Figure 11:
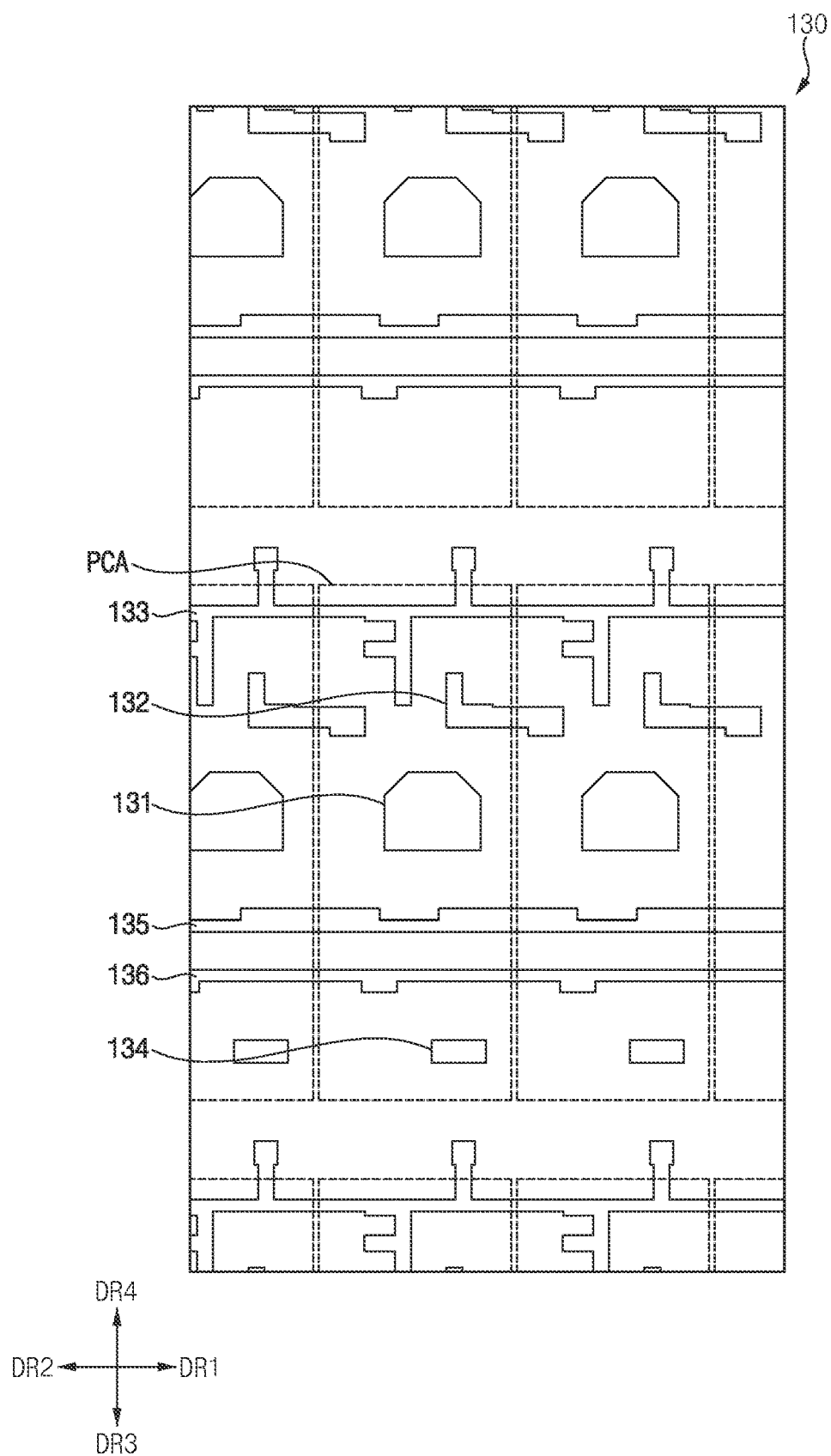

Referring to FIGS. 21 and 11, the first conductive layer 130 may be disposed on the active layer 120. The first conductive layer 130 may include a conductive material such as a metal, an alloy, a conductive metal nitride, a conductive metal oxide, or a transparent conductive material. Examples of the conductive material that can be used as the first conductive layer 130 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), alloys containing neodymium (Nd), iridium (Ir), aluminum (Al), alloys containing silver (Ag), alloys containing copper (Cu), alloys containing molybdenum (Mo), aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These may be used alone or in combination with each other.

A first insulating layer IL1 may be disposed between the active layer 120 and the first conductive layer 130. The first insulating layer IL1 may include an inorganic insulating material.

In an embodiment, as show in FIG. 11, the first conductive layer 130 may include a first conductive pattern 131, a data write gate pattern 132, a data initialization gate line 133, a light emitting device initialization gate pattern 134, a first conductive line 135, and a second conductive line 136.

Figure 12:
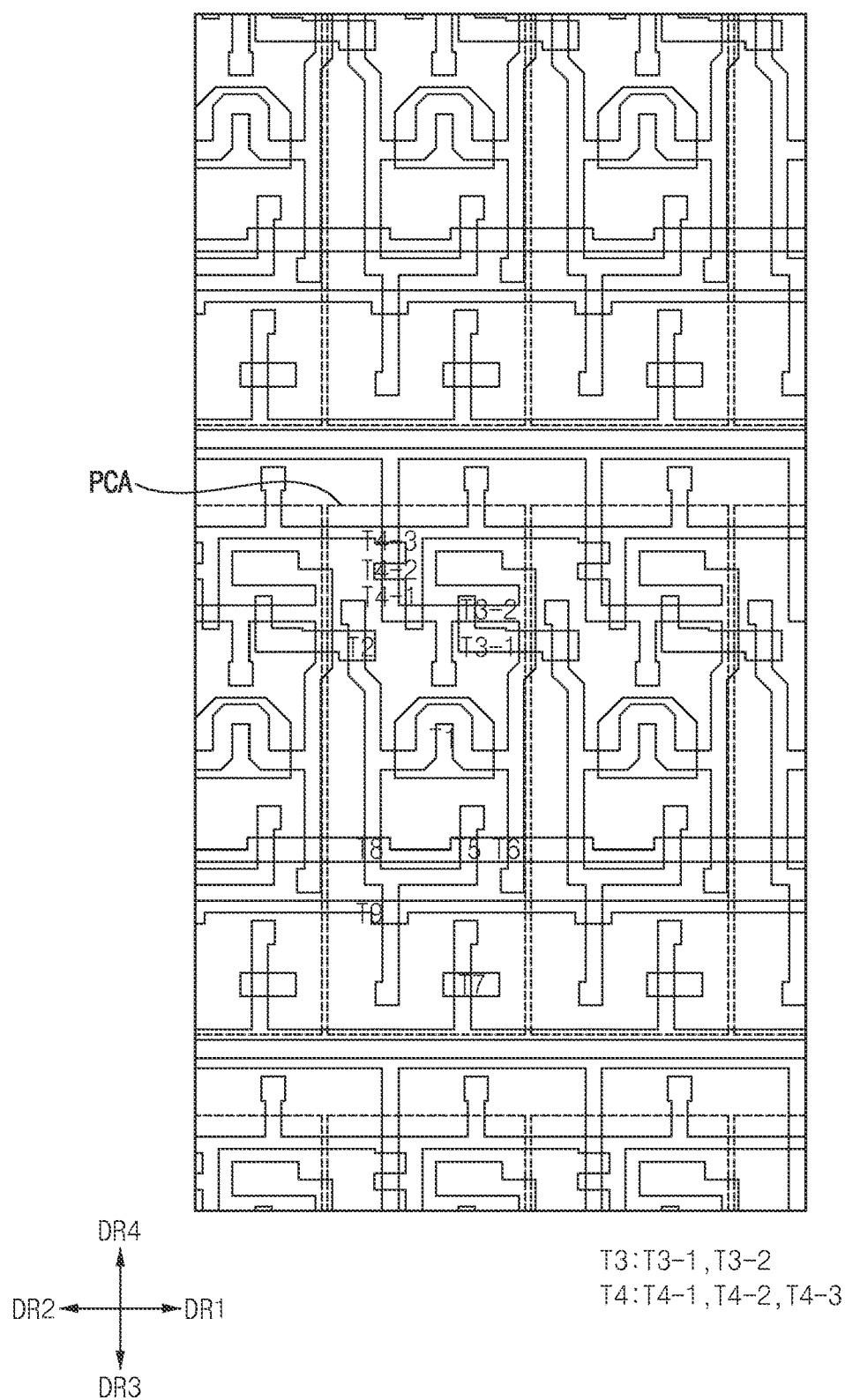

In an embodiment, as shown in FIG. 12, a portion of the first conductive pattern 131 overlapping the active pattern 121 may be the gate electrode of the first transistor T1. In such an embodiment, a portion of the active pattern 121 overlapping the first conductive pattern 131 may be a channel portion of the first transistor T1. Accordingly, the active pattern 121 and the first conductive pattern 131 may form (or collectively define) a first transistor T1.

In an embodiment, as show in FIG. 11, the data write gate pattern 132 may be spaced apart from the first conductive pattern 131 in a fourth direction DR4 opposite to the third direction DR3. The data write gate signal GW may be applied to the data write gate pattern 132.

In an embodiment, as shown in FIG. 12, a portion of the data write gate pattern 132 overlapping the active pattern 121 may be the gate electrode of the second transistor T2, and another portion of the data write gate pattern 132 overlapping the active pattern 121 may be a gate electrode of the first third transistor T3-1, and the other portion of the data write gate pattern 132 overlapping the active pattern 121 may be a gate electrode of the second third transistor T3-2. In such an embodiment, a portion of the active pattern 121 overlapping the data write gate pattern 132 may be a channel portion of the second transistor T2, and another portion of the active pattern 121 overlapping the data write gate pattern 132 may be a channel portion of the first third transistor T3-1 and the other portion of the active pattern 121 overlapping the data write gate pattern 132 may be a channel portion of the second third transistor T3-2. Accordingly, the active pattern 121 and the data write gate pattern 132 may form the second transistor T2 and the third transistor T3. That is, the third transistor T3 may have a dual-gate structure.

In an embodiment, as show in FIG. 11, the data initialization gate line 133 may extend in the first direction DR1.

The data initialization gate line 133 may be spaced apart from the data write gate pattern 132 in the fourth direction DR4. The data initialization gate signal GI may be applied to the data initialization gate line 133.

In an embodiment, as shown in FIG. 12, a portion of the data initialization gate line 133 overlapping the active pattern 121 may be a gate electrode of the first fourth transistor T4-1, and another portion of the data initialization gate line 133 overlapping the active pattern 121 may be a gate electrode of the second fourth transistor T4-2, and the other portion of the data initialization gate line 133 overlapping the active pattern 121 may be a gate electrode of the third fourth transistor T4-3. In such an embodiment, a portion of the active pattern 121 overlapping the data initialization gate line 133 may be a channel portion of the first fourth transistor T4-1, and another portion of the active pattern 121 overlapping the data initialization gate line 133 may be a channel portion of the second fourth transistor T4-2, and the other portion of the active pattern 121 overlapping the data initialization gate line 133 may be a channel portion of the third fourth transistor T4-3. Accordingly, the active pattern 121 and the data initialization gate line 133 may form the fourth transistor T4. That is, the fourth transistor T4 may have a triple-gate structure.

In an embodiment, as show in FIG. 11, the light emitting device initialization gate pattern 134 may be spaced apart from the first conductive pattern 131 in the third direction DR3. The light emitting device initialization gate signal GB may be applied to the light emitting device initialization gate pattern 134. In an embodiment, a portion of the light emitting device initialization gate pattern 134 overlapping the active pattern 121 may be the gate electrode of the seventh transistor T7. In such an embodiment, a portion of the active pattern 121 overlapping the light emitting device initialization gate pattern 134 may be a channel portion of the seventh transistor T7. Accordingly, the active pattern 121 and the light emitting device initialization gate pattern 134 may form a seventh transistor T7.

In an embodiment, as show in FIG. 11, the first conductive line 135 and the second conductive line 136 may extend in the first direction DR1. The first conductive line 135 and the second conductive line 136 may be positioned between the first conductive pattern 131 and the light emitting device initialization gate pattern 134. The first conductive line 135 and the second conductive line 136 may be separated from each other. The first emission signal EM may be applied to the first conductive line 135, and the second emission signal EMB may be applied to the second conductive line 136.

In an embodiment, as shown in FIG. 12, a portion of the first conductive line 135 overlapping the active pattern 121 may be the gate electrode of the fifth transistor T5, another portion of the first conductive line 135 overlapping the active pattern 121 may be the gate electrode of the sixth transistor T6, and the other portion of the first conductive line 135 overlapping the active pattern 121 may be the gate electrode of the eighth transistor T8. In such an embodiment, a portion of the active pattern 121 overlapping the first conductive line 135 may be a channel portion of the fifth transistor T5, another portion of the active pattern 121 overlapping the first conductive line 135 may be a channel portion of the sixth transistor T6, and the other portion of the active pattern 121 overlapping the first conductive line 135 may be a channel portion of the eighth transistor T8. Accordingly, the active pattern 121 and the first conductive line 135 may form a fifth transistor T5, a sixth transistor T6, and an eighth transistor T8.

In an embodiment, as shown in FIG. 12, a portion of the second conductive line 136 overlapping the active pattern 121 may be the gate electrode of the ninth transistor T9. In such an embodiment, a portion of the active pattern 121 overlapping the second conductive line 136 may be a channel portion of the ninth transistor T9. Accordingly, the active pattern 121 and the second conductive line 136 may form a ninth transistor T9.

Figure 13:
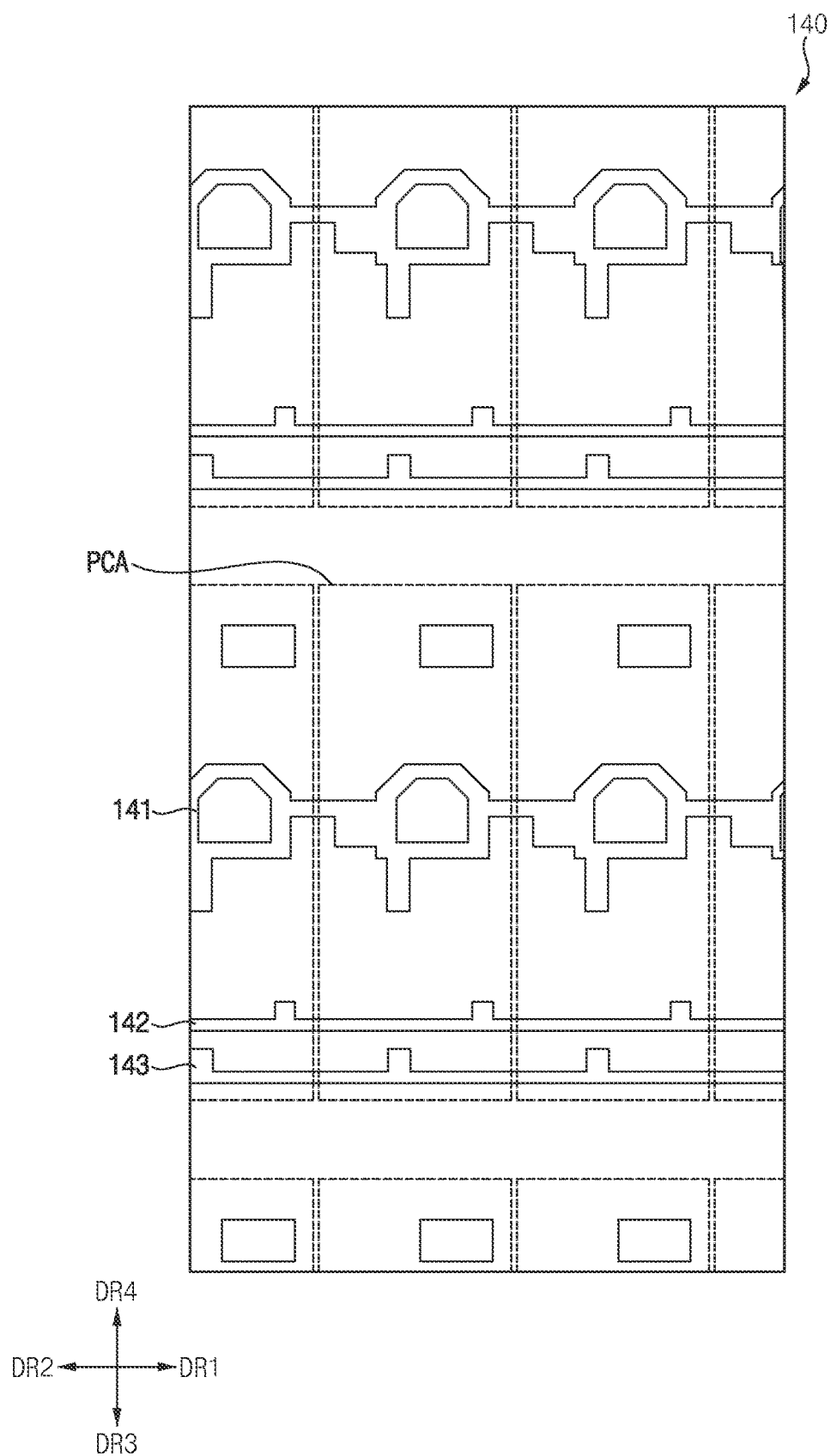

Referring to FIGS. 21 and 13, the second conductive layer 140 may be disposed on the first conductive layer 130. The second conductive layer 140 may include a conductive material.

A second insulating layer IL2 may be disposed between the first conductive layer 130 and the second conductive layer 140. The second insulating layer IL2 may include an inorganic insulating material.

Referring to FIGS. 21 and 13, the second conductive layer 140 may include a second conductive pattern 141, a third conductive line 142, and a fourth conductive line 143.

Figure 14:
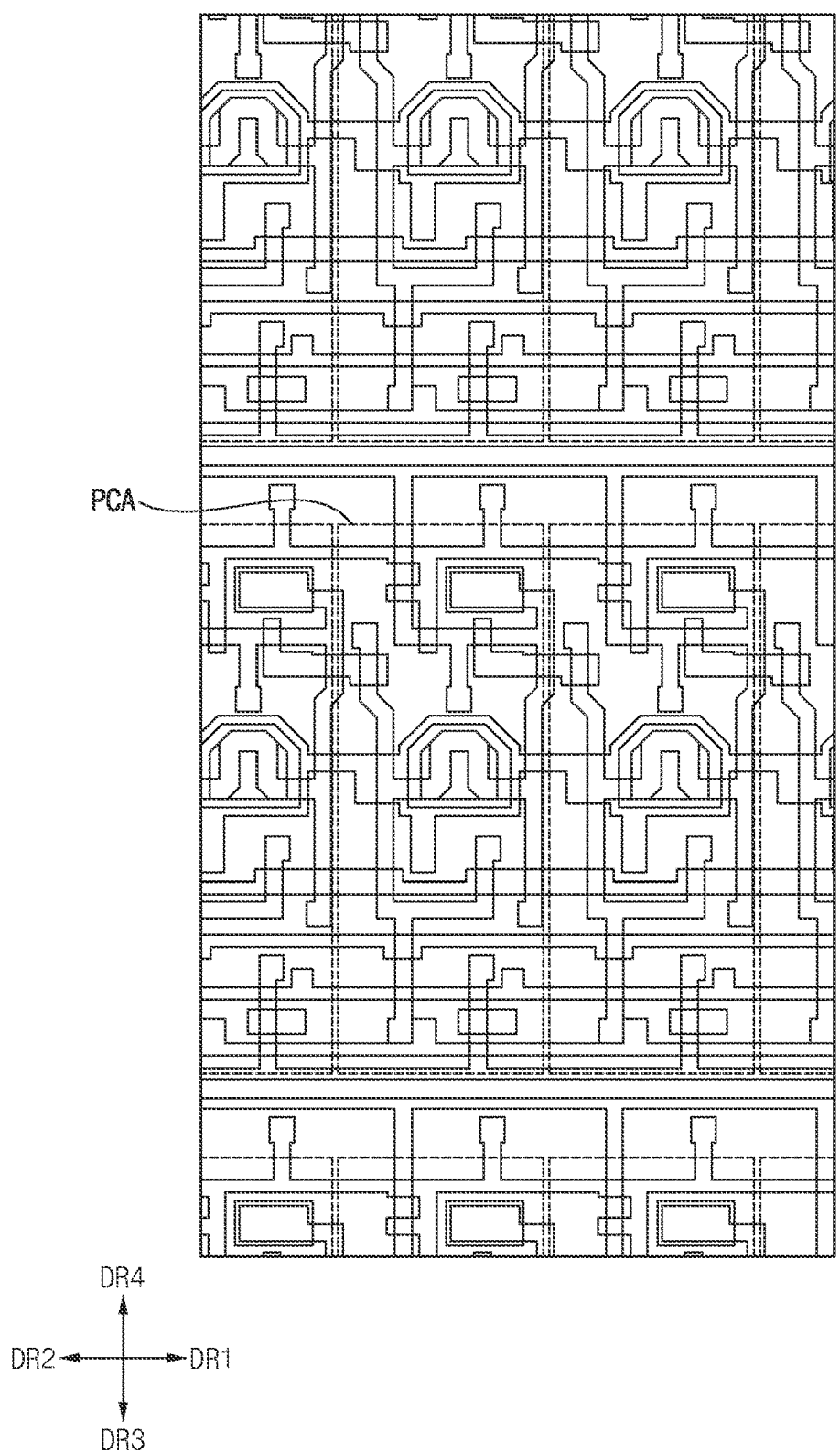

In an embodiment, as shown in FIG. 14, the second conductive pattern 141 may overlap the first conductive pattern 131. The first conductive pattern 131 and the second conductive pattern 141 may form the storage capacitor CST.

In an embodiment, as shown in FIG. 13, the third conductive line 142 may extend in the first direction DR1. The third conductive line 142 may be spaced apart from the second conductive pattern 141 in the third direction DR3. The second initialization signal VAINT may be applied to the third conductive line 142.

The fourth conductive line 143 may extend in the first direction DR1. The fourth conductive line 143 may be spaced apart from the third conductive line 142 in the third direction DR3. The first initialization signal VINT may be applied to the fourth conductive line 143.

Figure 15:
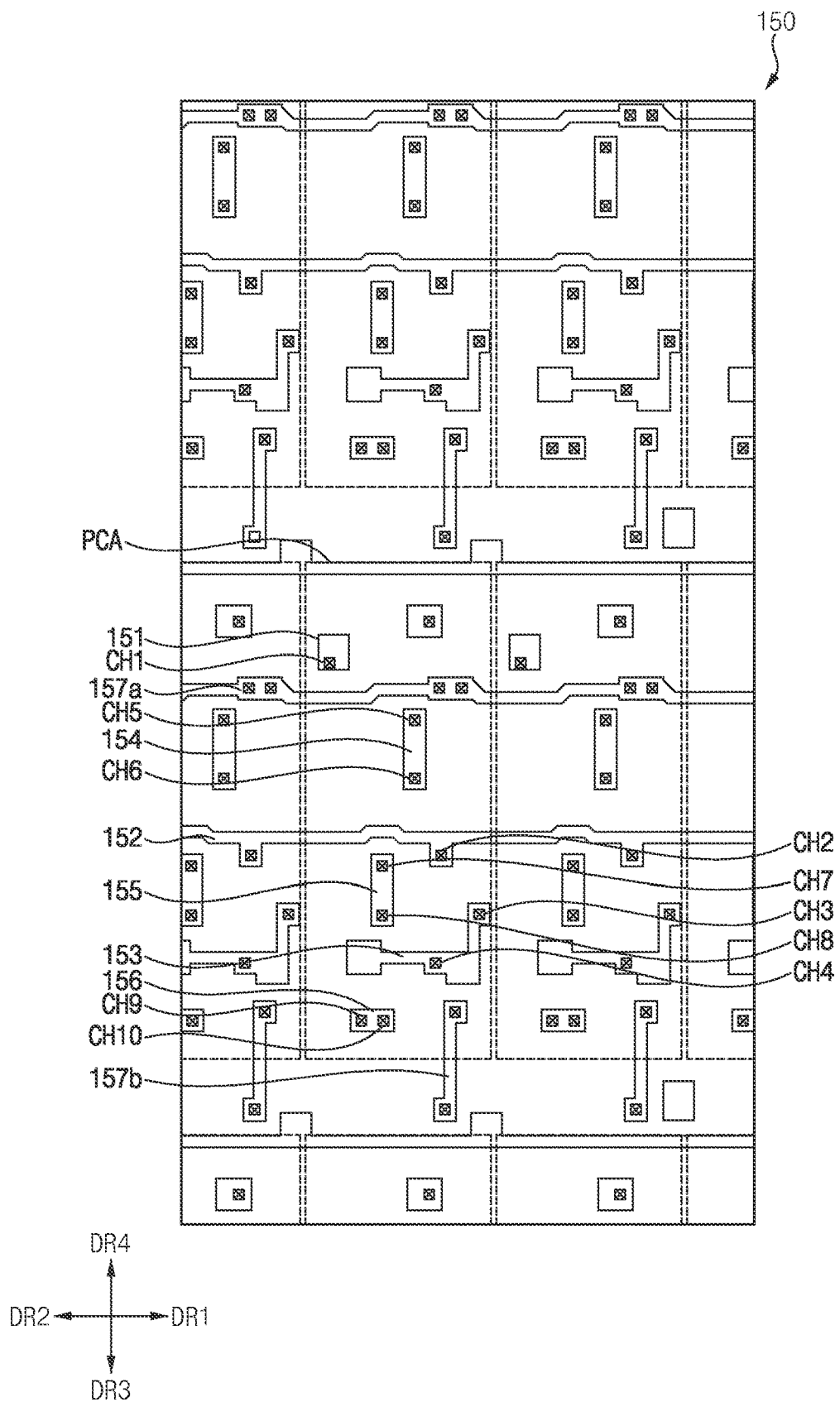

Referring to FIGS. 21 and 15, the third conductive layer 150 may be disposed on the second conductive layer 140. The third conductive layer 150 may include a conductive material.

A third insulating layer IL3 may be disposed between the second conductive layer 140 and the third conductive layer 150. The third insulating layer IL3 may include an inorganic insulating material.

The third conductive layer 150 may include a first contact pattern 151, a second contact pattern 152, a third contact pattern 153, a first connection pattern 154, a second connection pattern 155, and a third connection pattern 156.

Figure 16:
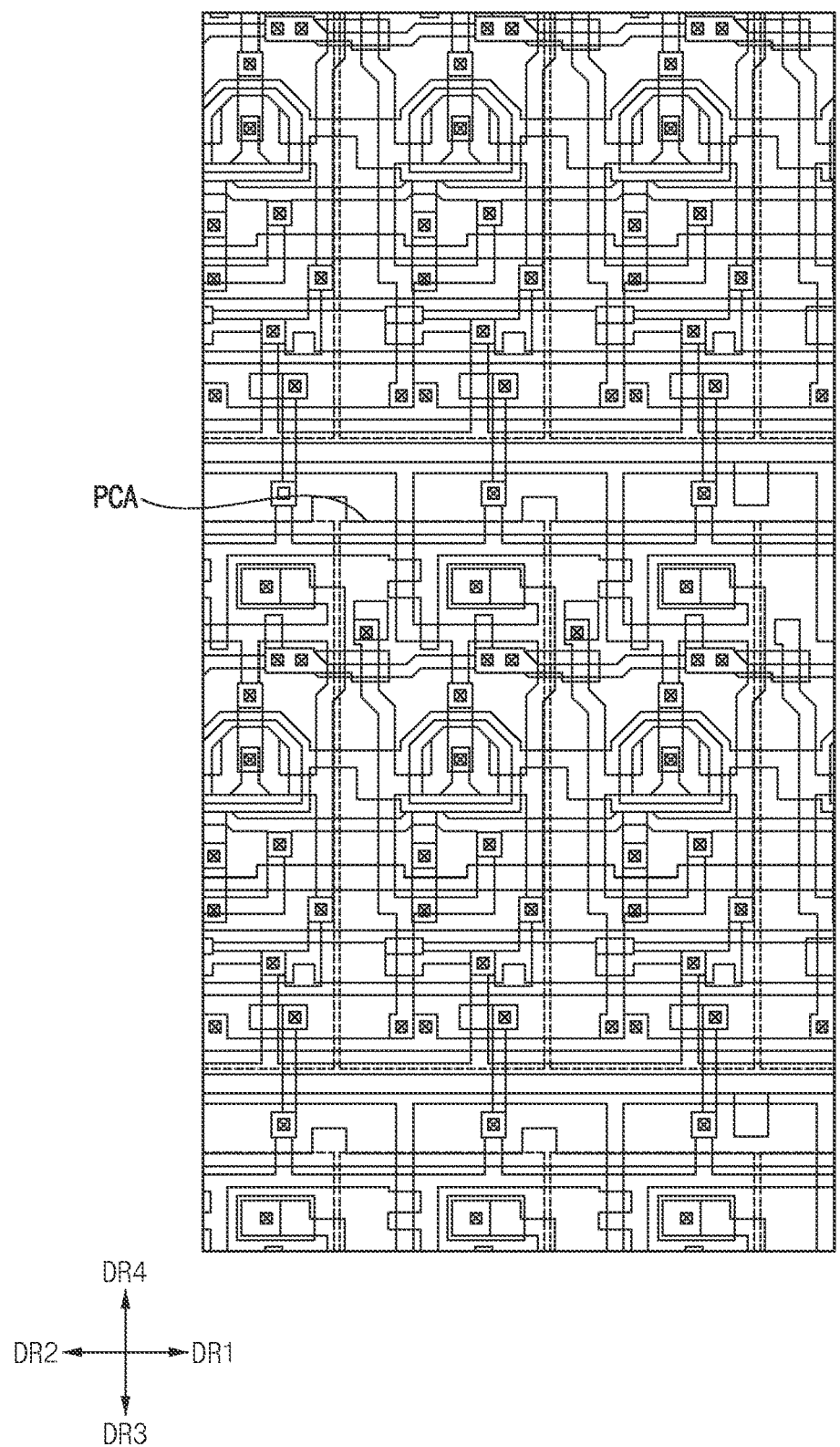

In an embodiment, as shown in FIGS. 15 and 16, the first contact pattern 151 may be connected to the active pattern 121 through a first contact hole CH1. Accordingly, the first contact pattern 151 may be electrically connected to the second transistor T2.

The second contact pattern 152 may be connected to the active pattern 121 through a second contact hole CH2. Accordingly, the second contact pattern 152 may be electrically connected to the fifth transistor T5.

The third contact pattern 153 may be connected to the active pattern 121 through third and fourth contact holes CH3 and CH4. Accordingly, the third contact pattern 153 may be electrically connected to the sixth transistor T6 and the seventh transistor T7.

The first connection pattern 154 may be connected to the active pattern 121 through a fifth contact hole CH5 and connected to the first conductive pattern 131 through a sixth contact hole CH6. Accordingly, the first connection pattern 154 may connect the active pattern 121 and the first conductive pattern 131. The first transistor T1 may be electrically connected to the fourth transistor T4 through the first connection pattern 154.

The second connection pattern 155 may be connected to the second conductive pattern 141 through a seventh contact hole CH7 and connected to the active pattern 121 through an eighth contact hole CH8. Accordingly, the storage capacitor CST may be electrically connected to the ninth transistor T9 through the second connection pattern 155.

The third connection pattern 156 may be connected to the active pattern 121 through a ninth contact hole CH9 and connected to the fourth conductive line 143 through a tenth contact hole CH10. Accordingly, the third connection pattern 156 may connect the active pattern 121 and the fourth conductive line 143.

In an embodiment, the third conductive layer 150 may further include gate signal transfer lines 157a and 157b. The gate signal transfer lines 157a and 157b may be connected to at least one selected from the data write gate pattern 132, the data initialization gate line 133, and the light emitting device initialization gate pattern 134 through a contact hole.

Figure 17:
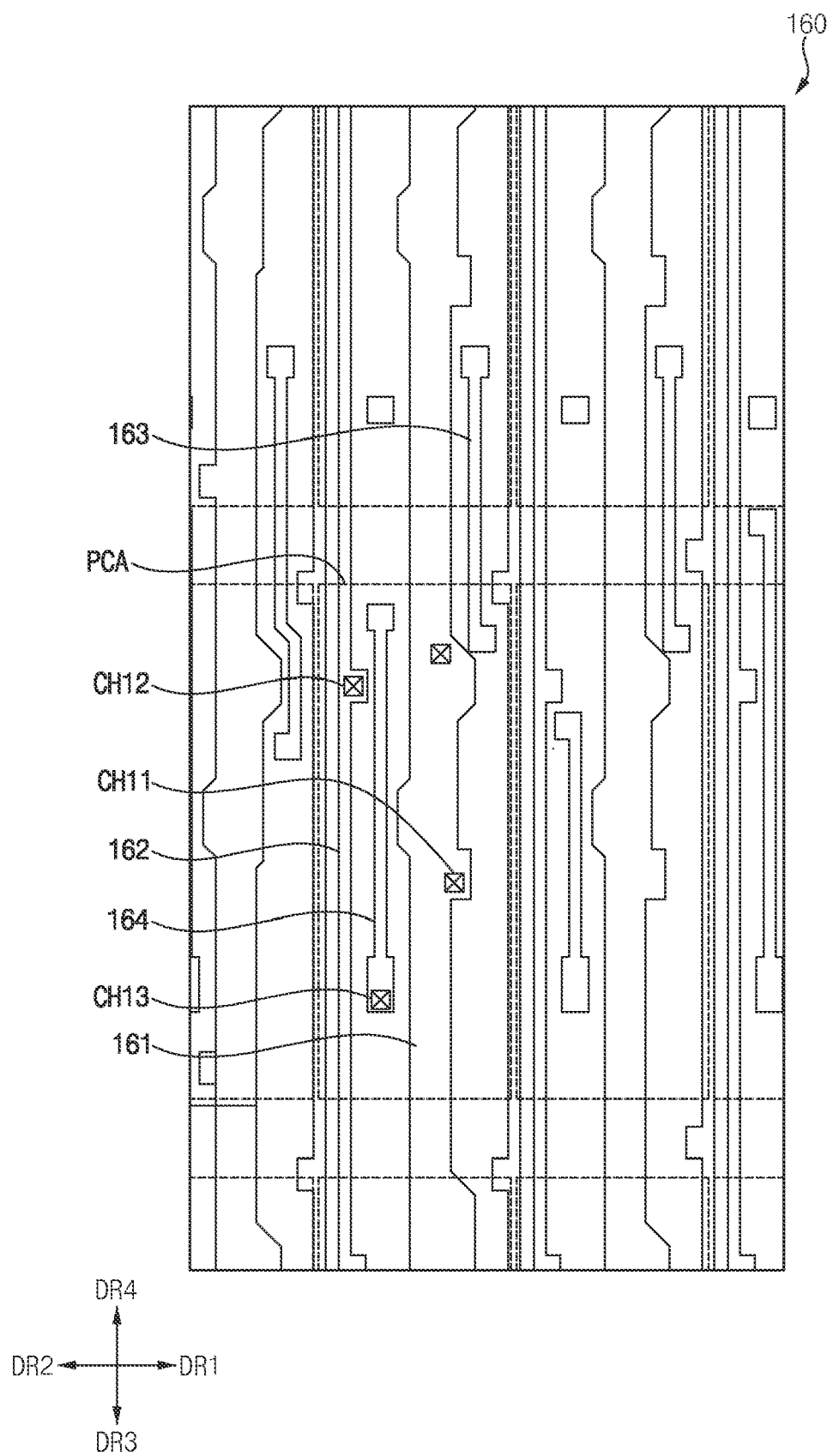

Referring to FIGS. 21 and 17, the fourth conductive layer 160 may be disposed on the third conductive layer 150. The fourth conductive layer 160 may include a conductive material.

A fourth insulating layer IL4 may be disposed between the third conductive layer 150 and the fourth conductive layer 160. The fourth insulating layer IL4 may include an inorganic insulating material.

In an embodiment, as shown in FIG. 17, the fourth conductive layer 160 may include a power voltage line 161, a data line 162, a first transmission line 163 and a second transmission line 164.

The fourth conductive layer 160 may include a conductive material such as metal, alloy, conductive metal nitride, conductive metal oxide, or transparent conductive oxide. Examples of the conductive material that can be used as the first conductive layer 130 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), alloys containing neodymium (Nd), iridium (Ir), aluminum (Al), alloys containing silver (Ag), alloys containing copper (Cu), alloys containing molybdenum (Mo), aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These may be used alone or in combination with each other. In an embodiment, the fourth conductive layer 160 may include a transparent conductive oxide.

The power voltage line 161 may extend in the third direction DR3. The high power supply voltage ELVDD may be applied to the power voltage line 161. The power voltage line 161 may transmit the high power supply voltage ELVDD to the first pixel circuit PC1 and the second pixel circuit PC2.

Figure 18:
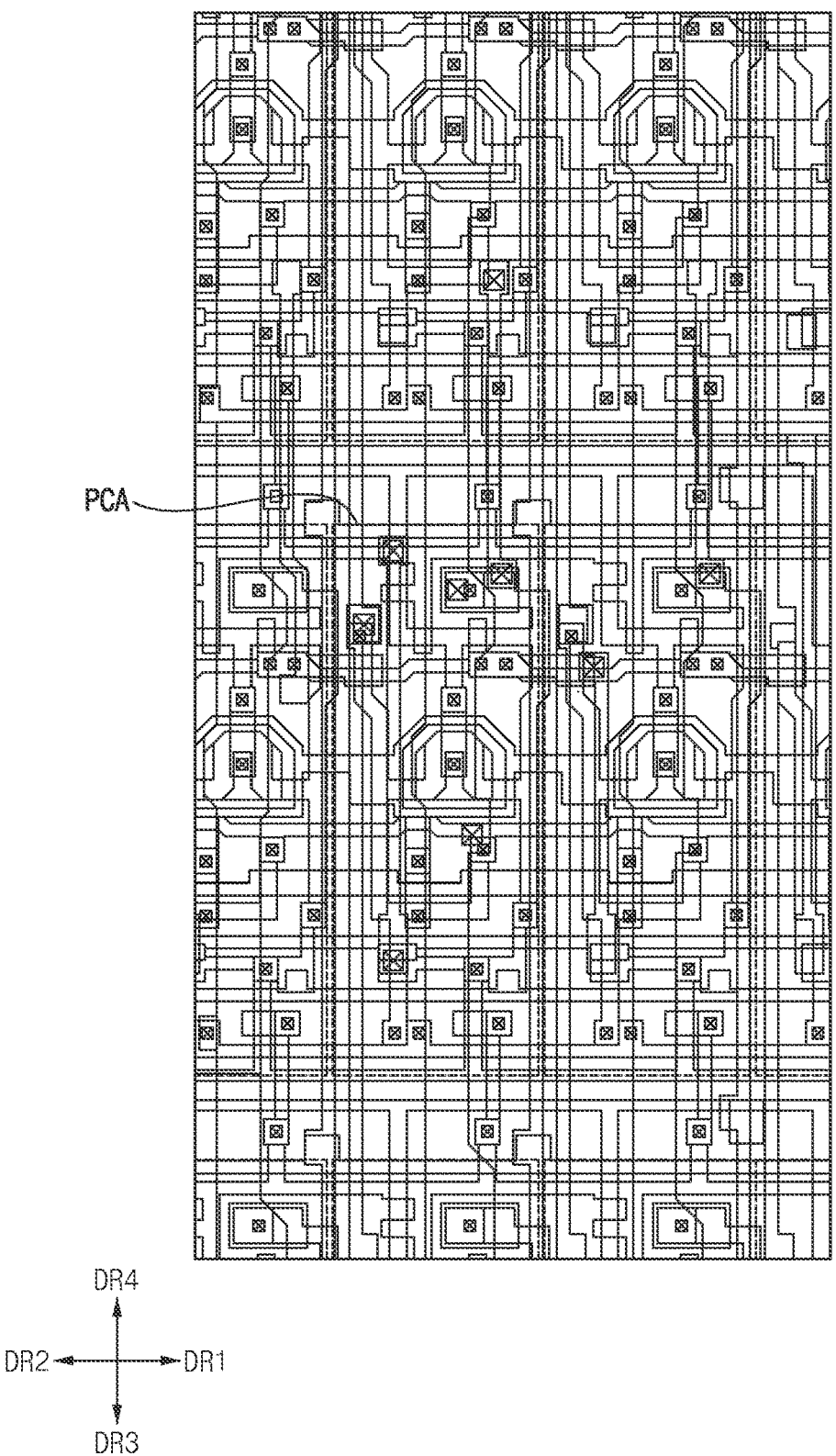

In an embodiment, as shown in FIGS. 17 and 18, the power voltage line 161 may be connected to the second contact pattern 152 through an eleventh contact hole CH11. Accordingly, the power voltage line 161 may be electrically connected to the fifth transistor T5 through the second contact pattern 152.

The data line 162 may extend in the third direction DR3. The data line 162 may be spaced apart from the power voltage line 161 in the second direction DR2. The data voltage VDATA may be applied to the data line 162.

In an embodiment, as shown in FIGS. 17 and 18, the data line 162 may be connected to the first contact pattern 151 through a twelfth contact hole CH12. Accordingly, the data line 162 may be electrically connected to the second transistor T2 through the first contact pattern 151.

The first transfer line 163 may extend in the third direction DR3. The first transmission line 163 may be spaced apart from the power voltage line 161 in the first direction DR1. In an embodiment, both ends of the first transmission line 163 may be positioned in each of the adjacent pixel circuit areas PCA in the third direction DR3. Although not shown, the first transmission line 163 may be connected to the third conductive layer 150 through a contact hole. The second transmission line 164 may extend in the third direction DR3. The second transmission line 164 may be spaced apart from the data line 162 in the first direction DR1 and may be spaced apart from the power voltage line 161 in the second direction DR2. That is, the second transmission line 164 may be positioned between the data line 162 and the power voltage line 161. The second transmission line 164 may be connected to the third contact pattern 153 through a thirteenth contact hole CH13.

The fifth conductive layer 170 may be disposed on the fourth conductive layer 160. The fifth conductive layer 170 may include a conductive material.

A fifth insulating layer IL5 may be disposed between the fourth conductive layer 160 and the fifth conductive layer 170. The fifth insulating layer IL5 may include an inorganic insulating material and/or an organic insulating material. In an embodiment, for example, the first to fifth insulating layers ILL IL2, IL3, IL4, and IL5 may form the insulating structure IL.

Figure 19:
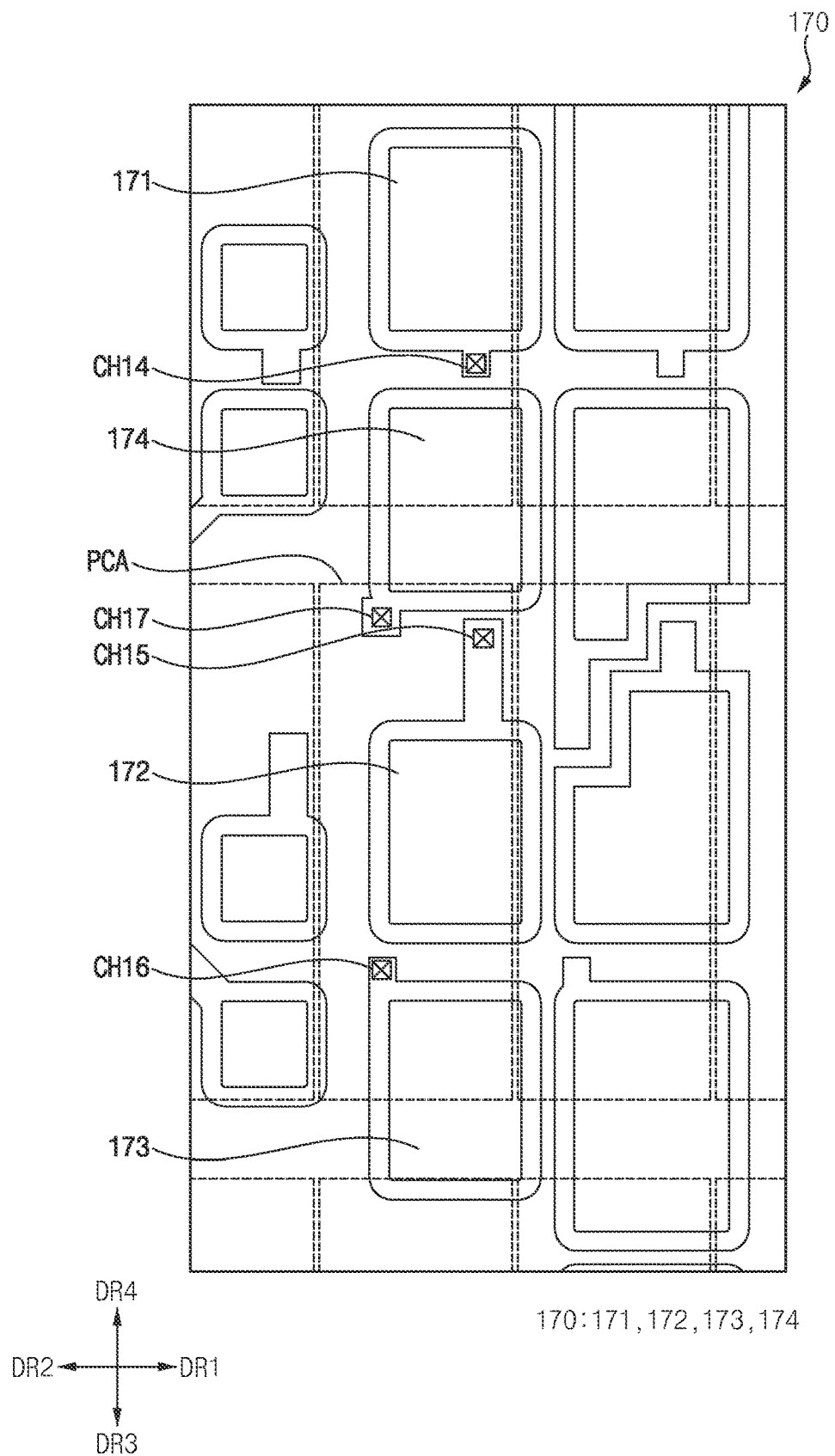

Referring to FIGS. 21 and 19, the fifth conductive layer 170 may include a third conductive pattern 171, a fourth conductive pattern 172, a fifth conductive pattern 173, and a sixth conductive pattern 174. All of the third conductive pattern 171, the fourth conductive pattern 172, the fifth conductive pattern 173, and the sixth conductive pattern 174 may be physically separated from each other. The third conductive pattern 171 may be the first electrode (e.g., the first main pixel electrode) of the first main light emitting device MLED1, the fourth conductive pattern 172 may be the first electrode (e.g., the first auxiliary pixel electrode) of the first auxiliary light emitting device SLED1, the fifth conductive pattern 173 may be the first electrode (e.g., the second main pixel electrode) of the second main light emitting device MLED2, and the sixth conductive pattern 174 may be the first electrode (e.g., the second auxiliary pixel electrode) of the second auxiliary light emitting device SLED2.

Figure 20:
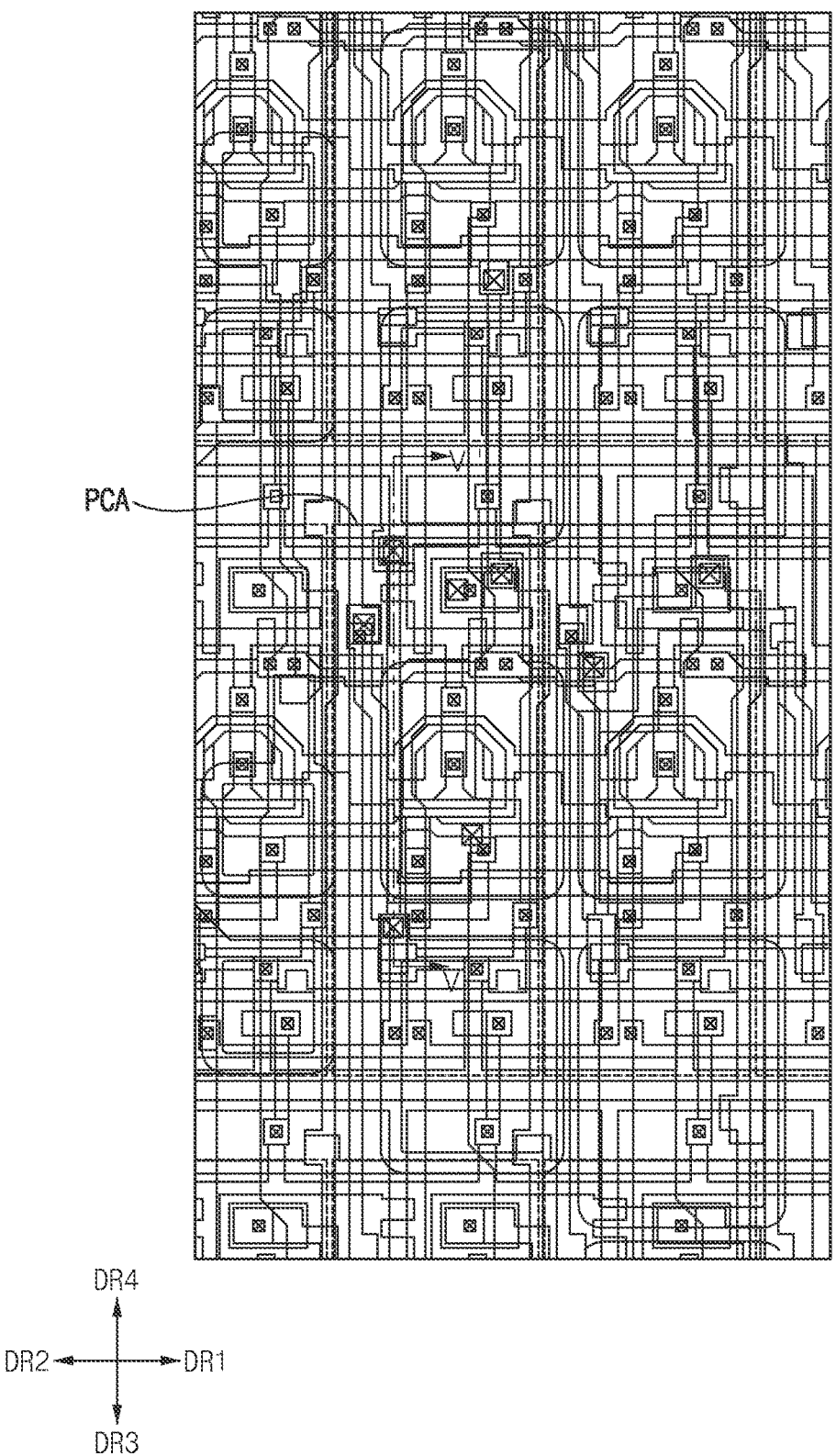
Figure 21:
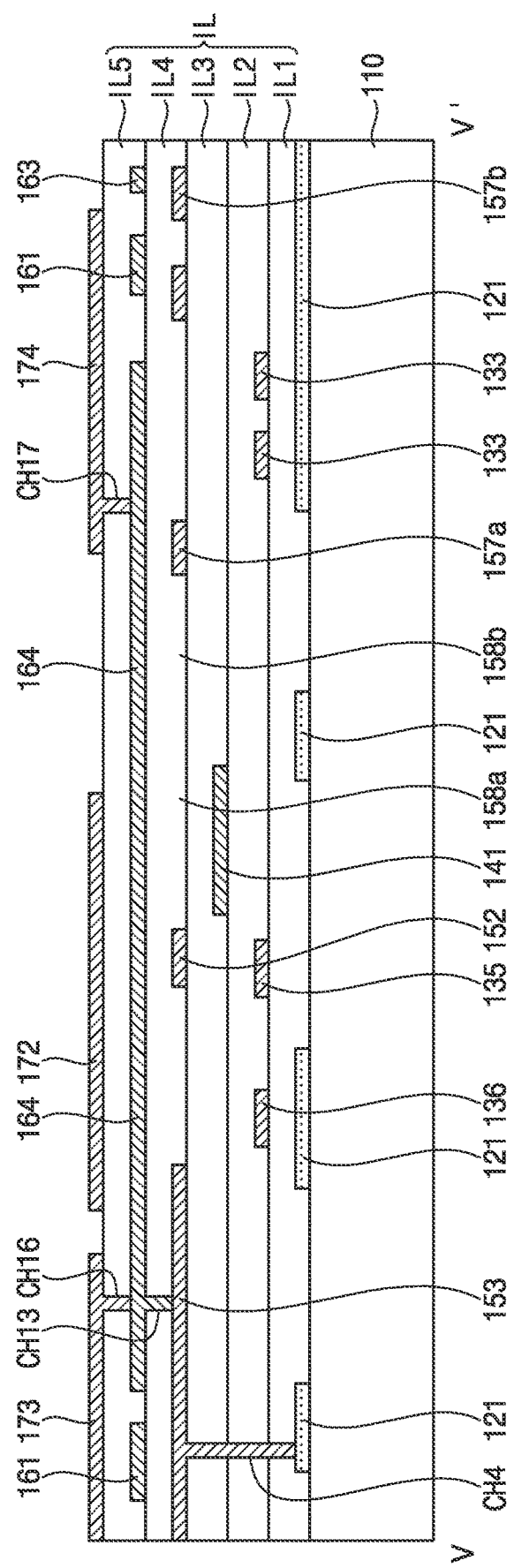
FIG. 21 is a cross-sectional view taken along line V-V' of FIG. 20.

In an embodiment, as shown in FIGS. 19 and 20, the third conductive pattern 171 may be connected to the first transmission line 163 through a fourteenth contact hole CH14, and the fourth conductive pattern 172 may be connected to the first transmission line 163 through a fifteenth contact hole CH15. Accordingly, the third conductive pattern 171 and the fourth conductive pattern 172 may be electrically connected by the first transmission line 163.

The fifth conductive pattern 173 may be connected to the second transmission line 164 through a sixteenth contact hole CH16, and the sixth conductive pattern 174 may be connected to the second transmission line 164 through a seventeenth contact hole CH17. Accordingly, the fifth conductive pattern 173 and the sixth conductive pattern 174 may be electrically connected by the second transmission line 164.

A pixel defining layer (e.g., the pixel defining layer PDL of FIG. 4) may be disposed on the fifth conductive layer 170. The pixel defining layer may define a pixel opening exposing at least a portion of each of the third conductive pattern 171, the fourth conductive pattern 172, the fifth conductive pattern 173, and the sixth conductive pattern 174.

The emission layer may be disposed on the fifth conductive layer 170. The emission layer may include a first emission pattern disposed on the third conductive pattern 171 exposed by the pixel opening, a second emission pattern disposed on the fourth conductive pattern 172 exposed by the pixel opening, a third emission pattern disposed on the fifth conductive pattern 173 exposed through the pixel opening, and a fourth emission pattern disposed on the sixth conductive pattern 174 exposed through the pixel opening. In an embodiment, for example, the first to fourth emission patterns may have a shape corresponding to each of the third to sixth conductive patterns 171, 172, 173, and 174. The first to fourth emission patterns may generate light of a same color as each other.

The sixth conductive layer may be disposed on the emission layer. In an embodiment, for example, the sixth conductive layer may be entirely disposed on the pixel circuit area PCA. The sixth conductive layer may include the second electrode (e.g., the common electrode) of the first main light emitting device MLED1, the second electrode (e.g., the common electrode) of the first auxiliary light emitting device SLED1, the second electrode (e.g., the common electrode) of and the second main light emitting device MLED2, and the second electrode (e.g., the common electrode) of the second auxiliary light emitting device SLED2. The third conductive pattern 171, the first emission pattern, and the sixth conductive layer may form the first main light emitting device MLED1, the fourth conductive pattern 172, the second emission pattern, and the sixth conductive layer may form the first auxiliary light emitting device SLED1, the fifth conductive pattern 173, the third emission pattern, and the sixth conductive layer may form the second main light emitting device MLED2, and the sixth conductive pattern 174, the fourth emission pattern, and the sixth conductive layer may form the second auxiliary light emitting device SLED2.

In an embodiment, as described above, the third conductive pattern 171 and the fourth conductive pattern 172 may be electrically connected by the first transmission line 163. Accordingly, the first main light emitting device MLED1 and the first auxiliary light emitting device SLED1 may be electrically connected to the first pixel circuit PC1. Accordingly, the operation of the first main light emitting device MLED1 and the operation of the first auxiliary light emitting device SLED1 may be controlled together by the first pixel circuit PC1.

In such an embodiment, the fourth conductive pattern 172 and the fifth conductive pattern 173 may be electrically connected by the second transmission line 164. Accordingly, the second main light emitting device MLED2 and the second auxiliary light emitting device SLED2 may be electrically connected to the second pixel circuit PC2. Accordingly, the operation of the second main light emitting device MLED2 and the operation of the second auxiliary light emitting device SLED2 may be controlled together by the second pixel circuit PC2.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a plurality of first pixels which emits light of different colors from each other;
   a plurality of second pixels which emits light of different colors from each other; and
   a light blocking member disposed on the first pixels and the second pixels, wherein the light blocking member blocks a portion of light emitted from the first pixels and a portion of light emitted from the second pixels,
   wherein each of the first pixels includes:
      a first pixel circuit;
      a first main light emitting device electrically connected to the first pixel circuit; and
      a first auxiliary light emitting device which emits light of a same color as the first main light emitting device and is electrically connected to the first main light emitting device,
   wherein each of the second pixels includes:
      a second pixel circuit;
      a second main light emitting device electrically connected to the second pixel circuit; and
      a second auxiliary light emitting device which emits light of a same color as the second main light emitting device and is electrically connected to the second main light emitting device, and
   wherein the first main light emitting device and the second auxiliary light emitting device are disposed in a first unit pixel area, and the second main light emitting device and the first auxiliary light emitting device are disposed in a second unit pixel area adjacent to the first unit pixel area.

2. The display panel of claim 1, wherein an operation of the first auxiliary light emitting device is controlled by the first pixel circuit, and
   wherein an operation of the second auxiliary light emitting device is controlled by the second pixel circuit.

3. The display panel of claim 1, wherein an operation of the first main light emitting device and an operation of the first auxiliary light emitting device are controlled together by the first pixel circuit, and
   wherein an operation of the second main light emitting device and an operation of the second auxiliary light emitting device are controlled together by the second pixel circuit.

4. The display panel of claim 1, wherein the first main light emitting device of one first pixel and the second auxiliary light emitting device of one second pixel corresponding to the one first pixel emit light of a same color as each other, and
   wherein the second main light emitting device of the one second pixel and the first auxiliary light emitting device of the one first pixel emit light of a same color as each other.

5. The display panel of claim 1, further comprising:
   a first transmission line electrically connected to the first auxiliary light emitting device and the first main light emitting device; and a second transmission line electrically connected to the second auxiliary light emitting device and the second main light emitting device.

6. The display panel of claim 5, wherein the first transmission line and the second transmission line include a transparent conductive oxide.

7. The display panel of claim 6, further comprising:
a data line which transmits a data voltage to the first pixels and the second pixels, and
wherein the first transmission line and the second transmission line are disposed in a same layer as the data line.

8. The display panel of claim 7, wherein the first transmission line and the second transmission line include a same material as the data line.

9. The display panel of claim 1, wherein a pixel opening exposing a portion of a pixel electrode of the first main light emitting device and a pixel opening exposing a portion of a pixel electrode of the second auxiliary light emitting device are defined in the first unit pixel area, and
wherein a pixel opening exposing a portion of a pixel electrode of the second main light emitting device and a pixel opening exposing a portion of a pixel electrode of the first auxiliary light emitting device are defined in the second unit pixel area.

10. The display panel of claim 1, wherein a number of the first main light emitting device disposed in the first unit pixel area and a number of the second auxiliary light emitting device disposed in the first unit pixel area are the same as each other, and
wherein a number of the second main light emitting device disposed in the second unit pixel area and a number of the first auxiliary light emitting device disposed in the second unit pixel area are the same as each other.

11. The display panel of claim 1, wherein the first pixels include a first first pixel, a second first pixel, and a third first pixel,
wherein the first main light emitting device of the first first pixel, the first main light emitting device of the second first pixel, and the first main light emitting device of the third first pixel are arranged in a line in the first unit pixel area, and
wherein the first auxiliary light emitting device of the first first pixel, the first auxiliary light emitting device of the second first pixel, and the first auxiliary light emitting device of the third first pixel are arranged in a line in the second unit pixel area.

12. The display panel of claim 1, wherein the second pixels include a first second pixel, a second second pixel, and a third second pixel,
wherein the second main light emitting device of the first second pixel, the second main light emitting device of the second second pixel, and the second main light emitting device of the third second pixel are arranged in a line in the second unit pixel area, and
wherein the second auxiliary light emitting device of the first second pixel, the second auxiliary light emitting device of the second second pixel, and the second auxiliary light emitting device of the third second pixel are arranged in a line in the first unit pixel area.

13. The display panel of claim 1, wherein the first pixels include a first first pixel, a second first pixel, and a third first pixel,
wherein the first main light emitting device of the first first pixel, the first main light emitting device of the second first pixel, and the first main light emitting device of the third first pixel are disposed at vertices of imaginary triangles in the first unit pixel area, and
wherein the first auxiliary light emitting device of the first first pixel, the first auxiliary light emitting device of the second first pixel, and the first auxiliary light emitting device of the third first pixel are disposed at vertices of imaginary triangles in the second unit pixel area.

14. The display panel of claim 1, wherein the second pixels include a first second pixel, a second second pixel, and a third second pixel,
wherein the second main light emitting device of the first second pixel, the second main light emitting device of the second second pixel, and the second main light emitting device of the third second pixel are disposed at vertices of imaginary triangles in the second unit pixel area, and
wherein the second auxiliary light emitting device of the first second pixel, the second auxiliary light emitting device of the second second pixel, and the second auxiliary light emitting device of the third second pixel are disposed at vertices of imaginary triangles in the first unit pixel area.

15. The display panel of claim 1, wherein the light blocking member blocks a portion of light emitted from the first main light emitting device and the first auxiliary light emitting device traveling in a first direction and blocks a portion of light emitted from the second main light emitting device and the second auxiliary light emitting device traveling in a second direction opposite to the first direction.

16. The display panel of claim 15, wherein the light blocking member surrounds each of the first main light emitting device and the second auxiliary light emitting device in a plan view,
wherein a first distance between an edge of the first main light emitting device in the first direction from a center thereof and the light blocking member is less than a second distance between an edge of the first main light emitting device in the second direction from the center thereof and the light blocking member, and
wherein a third distance between an edge of the second auxiliary light emitting device in the first direction from a center thereof and the light blocking member is greater than a fourth distance between an edge of the second auxiliary light emitting device in the second direction from the center thereof and the light blocking member.

17. The display panel of claim 15, wherein the light blocking member surrounds each of the second main light emitting device and the first auxiliary light emitting device in a plan view,
wherein a fifth distance between an edge of the first auxiliary light emitting device in the first direction from a center thereof and the light blocking member is less than a sixth distance between an edge of the first auxiliary light emitting device in the second direction from the center thereof and the light blocking member, and
wherein a seventh distance between an edge of the second main light emitting device in the first direction from a center thereof and the light blocking member is greater than an eighth distance between an edge of the second main light emitting device in the second direction from the center thereof and the light blocking member.

18. A display device comprising:
a display panel including a plurality of first pixels which emit light of different colors from each other, a plurality of second pixels which emit light of different colors from each other, and a light blocking member disposed on the first pixels and the second pixels, wherein the light blocking member blocks a portion of light emitted from the first pixels and a portion of light emitted from the second pixels;

a gate driver which provides a gate signal to the display panel;

a data driver which provides a data voltage to the display panel; and an emission driver which provides an emission signal to the display panel, wherein each of the first pixels includes:
- a first pixel circuit;
- a first main light emitting device electrically connected to the first pixel circuit; and
- a first auxiliary light emitting device which emits light of a same color as the first main light emitting device and is electrically connected to the first main light emitting device, wherein each of the second pixels includes:
- a second pixel circuit;
- a second main light emitting device electrically connected to the second pixel circuit; and
- a second auxiliary light emitting device which emits light of a same color as the second main light emitting device and is electrically connected to the second main light emitting device, and wherein the first main light emitting device and the second auxiliary light emitting device are disposed in a first unit pixel area, and the second main light emitting device and the first auxiliary light emitting device are disposed in a second unit pixel area adjacent to the first unit pixel area.

19. The display device of claim 18, wherein an operation of the first main light emitting device and an operation of the first auxiliary light emitting device are controlled together by the first pixel circuit, and wherein an operation of the second main light emitting device and an operation of the second auxiliary light emitting device are controlled together by the second pixel circuit.

20. The display device of claim 18, further comprising:
- a data line which transmits the data voltage to the first pixels and the second pixels;
- a first transmission line electrically connected to the first auxiliary light emitting device and the first main light emitting device and disposed in a same layer as the data line; and
- a second transmission line electrically connected to the second auxiliary light emitting device and the second main light emitting device and disposed in a same layer as the data line.

21. The display device of claim 20, wherein the first transmission line and the second transmission line include a transparent conductive oxide.

22. The display device of claim 18, wherein the light blocking member blocks a portion of light emitted from the first main light emitting device and the first auxiliary light emitting device traveling in a first direction and a portion of light emitted from the second main light emitting device and the second auxiliary light emitting device traveling in a second direction opposite to the first direction.

* * * * *